United States Patent
Takamori et al.

(10) Patent No.: US 9,952,295 B2
(45) Date of Patent: Apr. 24, 2018

(54) MEDICAL IMAGE DIAGNOSTIC APPARATUS AND MAGNETIC RESONANCE IMAGING APPARATUS

(71) Applicant: Toshiba Medical Systems Corporation, Otawara-shi (JP)

(72) Inventors: Hiromitsu Takamori, Yokohama (JP); Yu Ueda, Utsunomiya (JP); Takashi Sasaki, Yokohama (JP); Aira Hotta, Kawasaki (JP); Takahiro Murata, Sagamihara (JP)

(73) Assignee: Toshiba Medical Systems Corporation, Otawara-shi (JP)

( * ) Notice: Subject to any disclaimer, the term of this patent is extended or adjusted under 35 U.S.C. 154(b) by 0 days.

(21) Appl. No.: 15/334,777

(22) Filed: Oct. 26, 2016

(65) Prior Publication Data

US 2017/0123021 A1    May 4, 2017

(30) Foreign Application Priority Data

Oct. 30, 2015 (JP) .................. 2015-214742

(51) Int. Cl.
| | |
|---|---|
| G03B 21/56 | (2006.01) |
| G01R 33/28 | (2006.01) |
| G03B 21/13 | (2006.01) |
| G03B 21/20 | (2006.01) |
| G02B 5/02 | (2006.01) |
| G03B 21/28 | (2006.01) |

(52) U.S. Cl.
CPC ......... *G01R 33/283* (2013.01); *G02B 5/0284* (2013.01); *G03B 21/13* (2013.01); *G03B 21/2046* (2013.01); *G03B 21/28* (2013.01); *G03B 21/562* (2013.01)

(58) Field of Classification Search
CPC .......... G01R 33/28; G02B 5/02; G03B 21/13; G03B 21/20; G03B 21/28; G03B 21/56
See application file for complete search history.

(56) References Cited

U.S. PATENT DOCUMENTS

| | | | |
|---|---|---|---|
| 2010/0159198 A1* | 6/2010 | Robinson | ................. C08J 7/047 428/141 |
| 2013/0218004 A1* | 8/2013 | Yang | .................... A61B 5/0033 600/415 |
| 2013/0235168 A1 | 9/2013 | Gillies et al. | |
| 2014/0125337 A1* | 5/2014 | Lee | ...................... G01R 33/307 324/309 |
| 2015/0031984 A1* | 1/2015 | Driemel | ............... G01R 33/283 600/415 |

FOREIGN PATENT DOCUMENTS

| | | |
|---|---|---|
| JP | 1-249044 | 10/1989 |
| JP | 2003-190112 | 7/2003 |
| JP | 2013-546024 | 12/2013 |

* cited by examiner

*Primary Examiner* — Sultan Chowdhury
*Assistant Examiner* — Danell L Owens
(74) *Attorney, Agent, or Firm* — Oblon, McClelland, Maier & Neustadt, L.L.P.

(57) ABSTRACT

According to one embodiment, a medical image diagnostic apparatus includes a gantry and a screen. The gantry for medical imaging includes a bore. The screen is insertable into the bore. A predetermined image is projected by a projector on the screen. The screen forms a shape that enables light generated by the projector to arrive at an inner wall of the gantry.

11 Claims, 24 Drawing Sheets

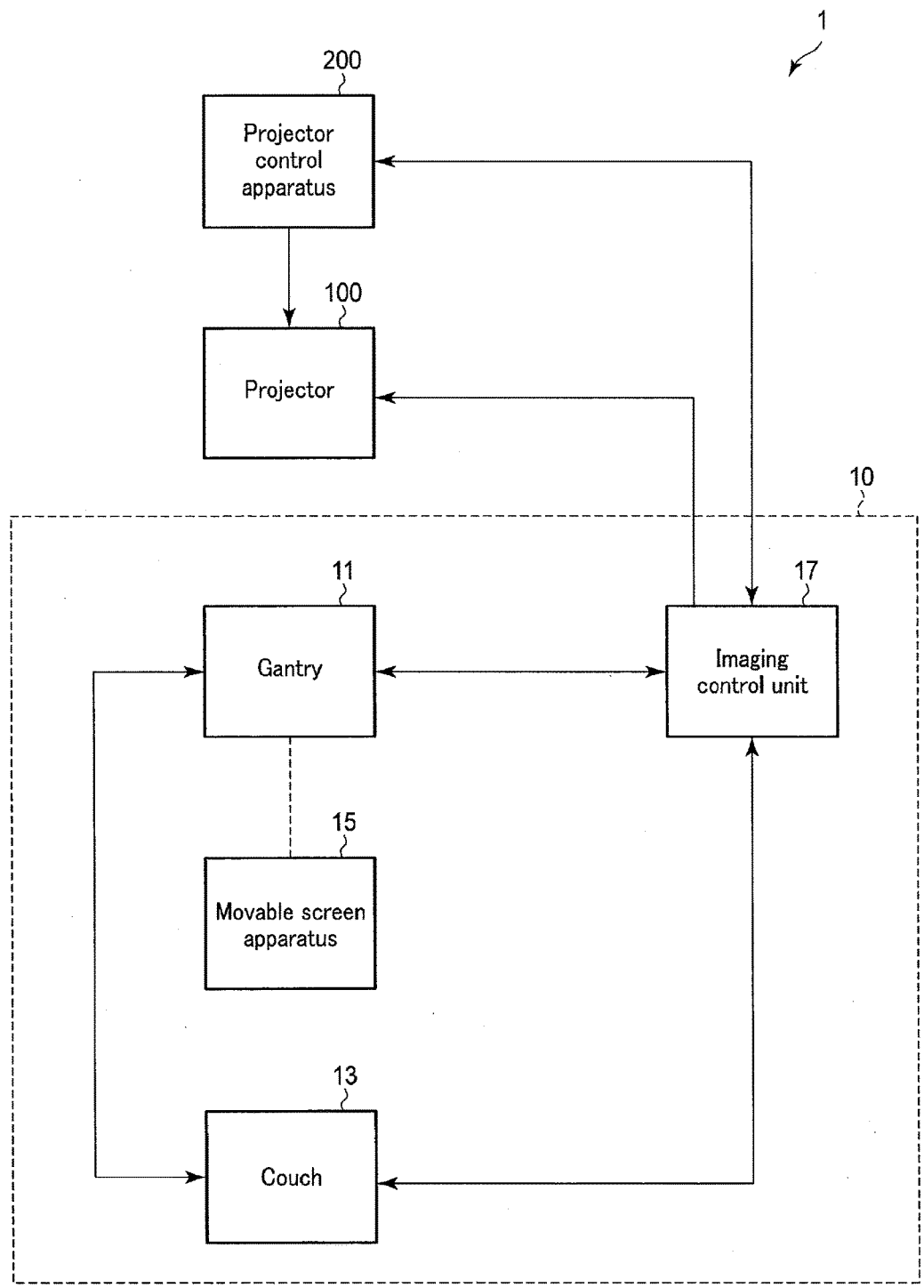
F I G. 1

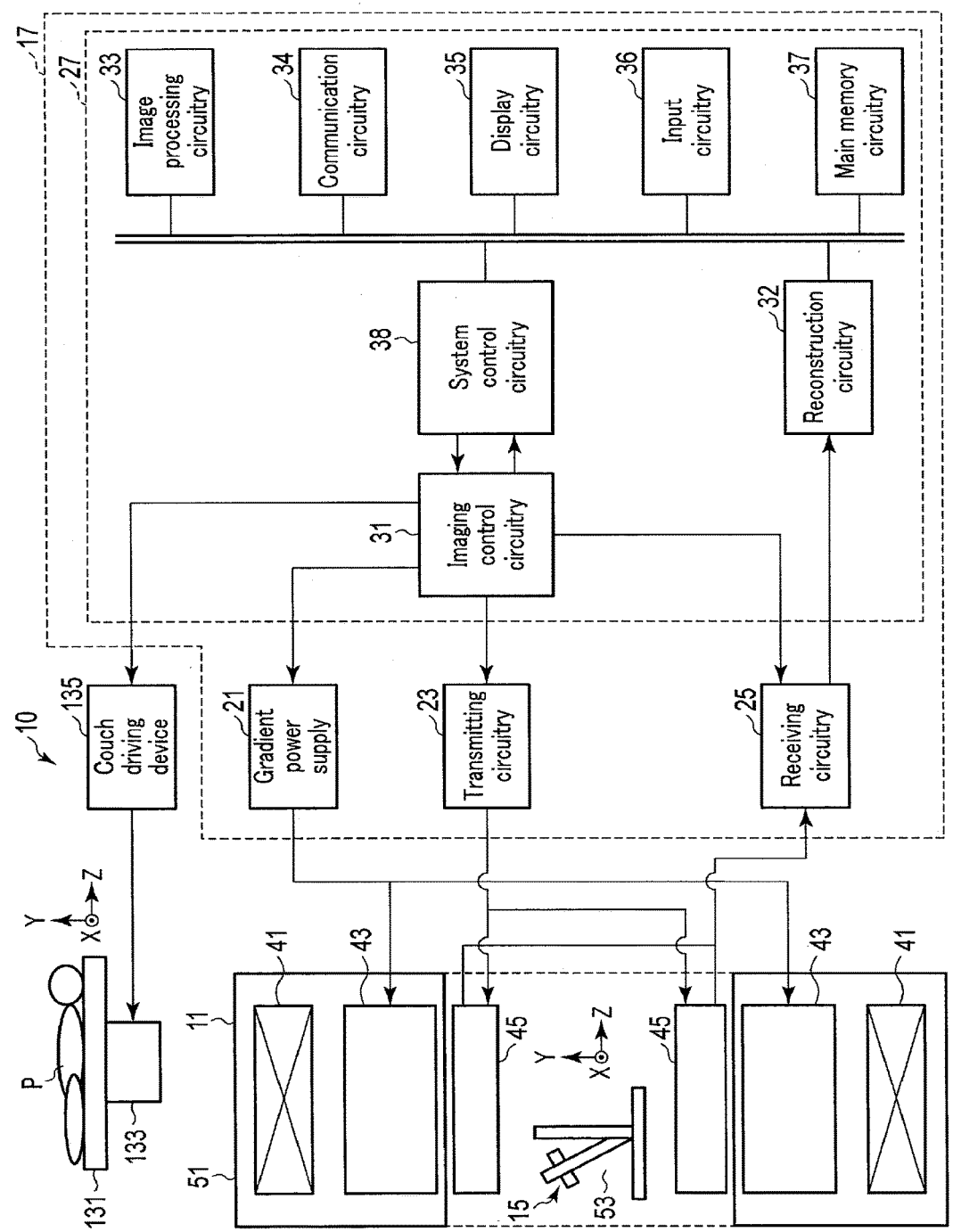
F I G. 2

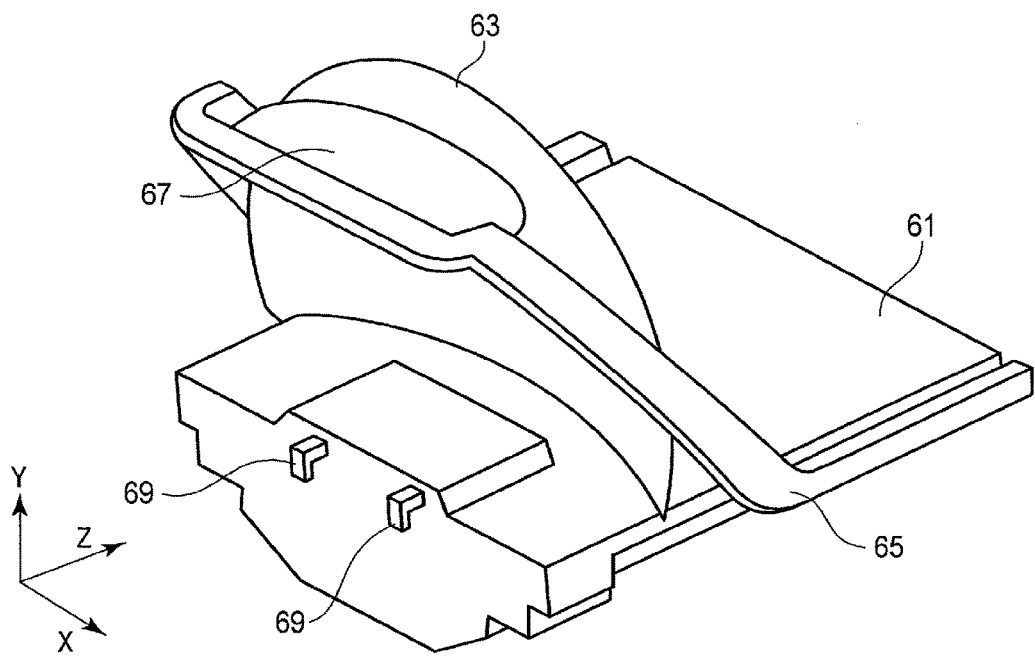
F I G. 5
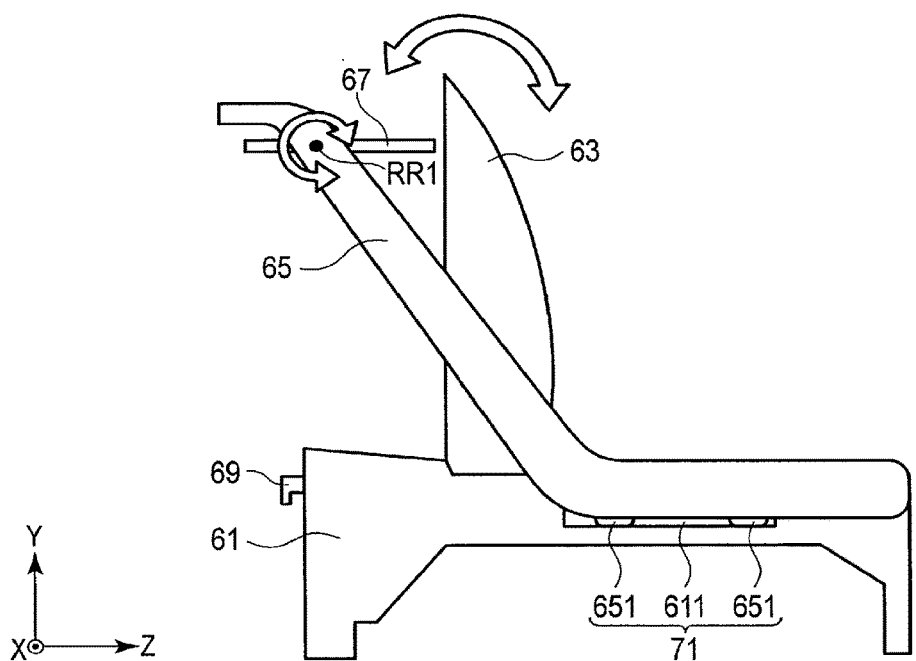
F I G. 6

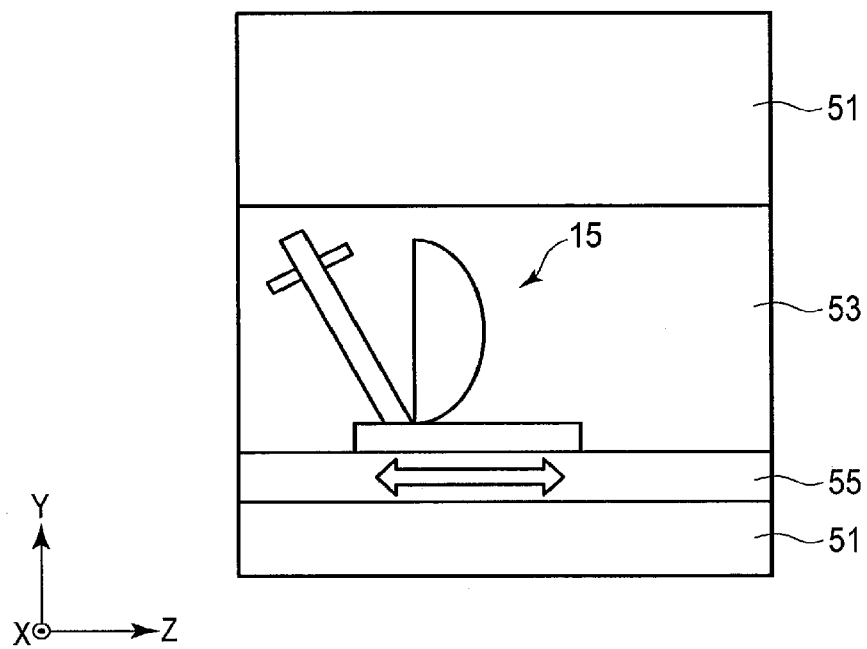
F I G. 11

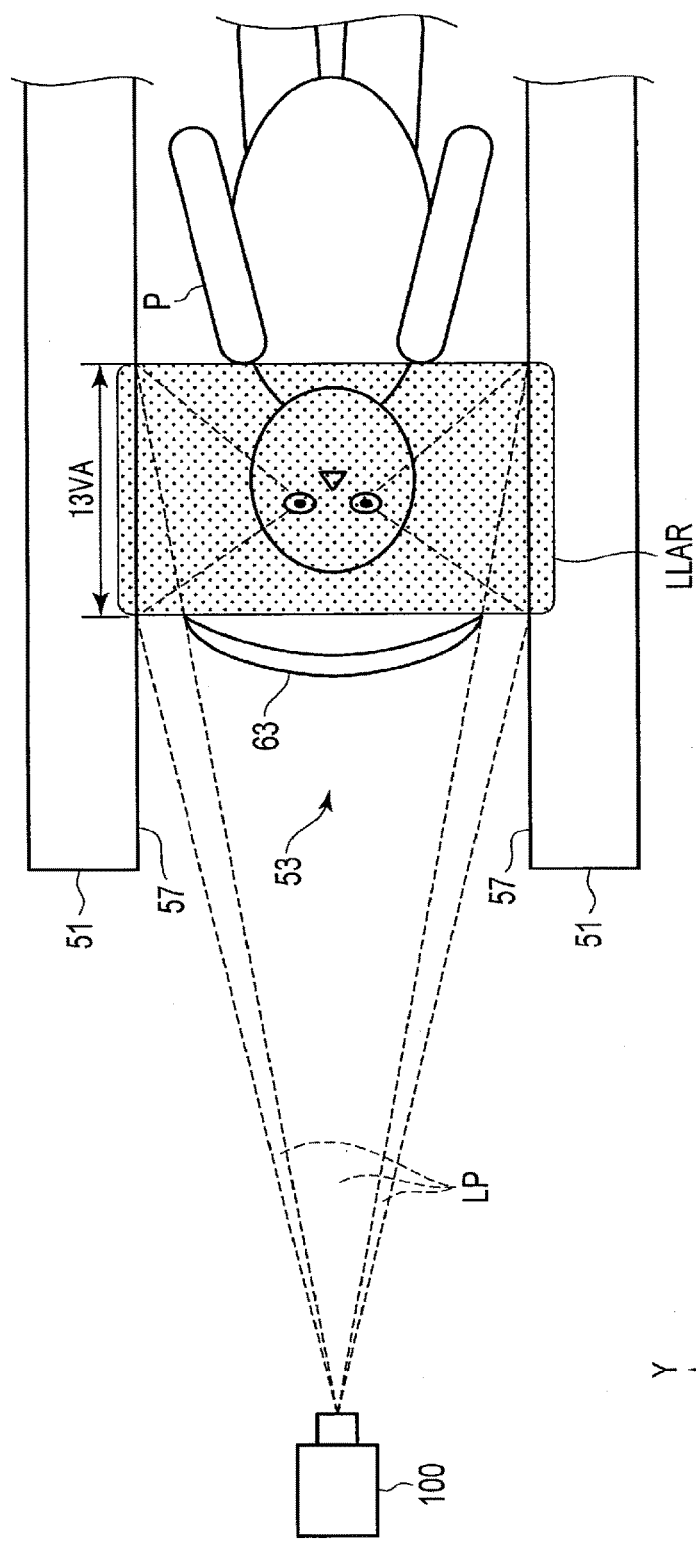
F I G. 13

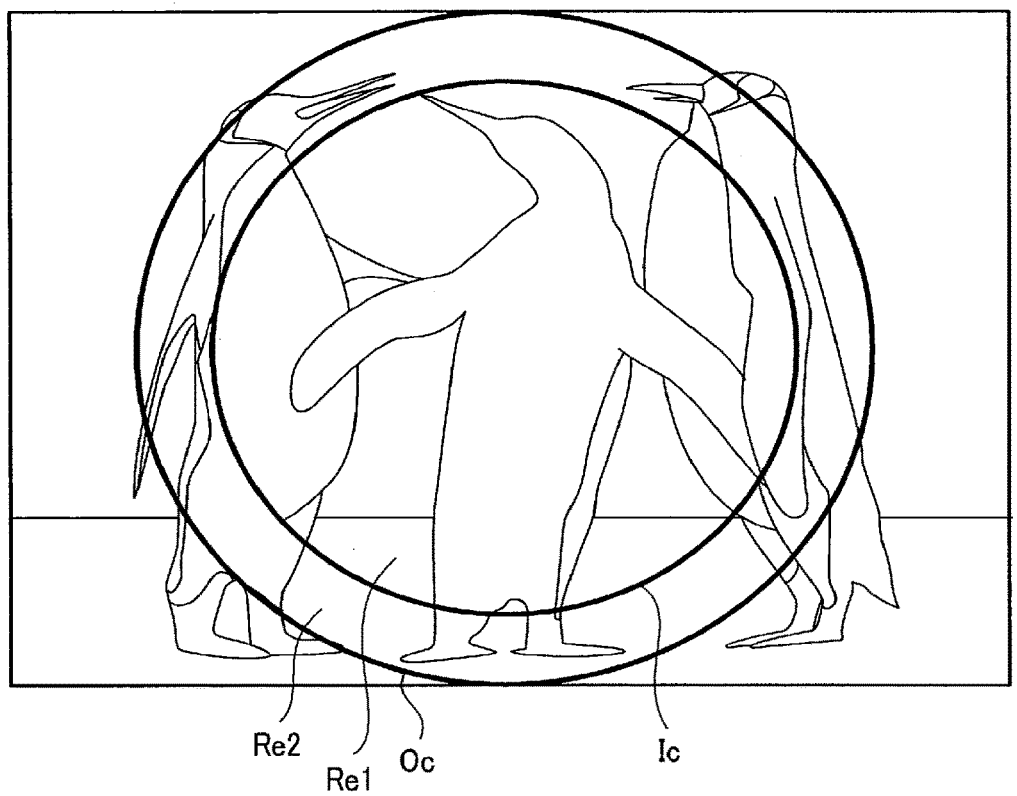
F I G. 14

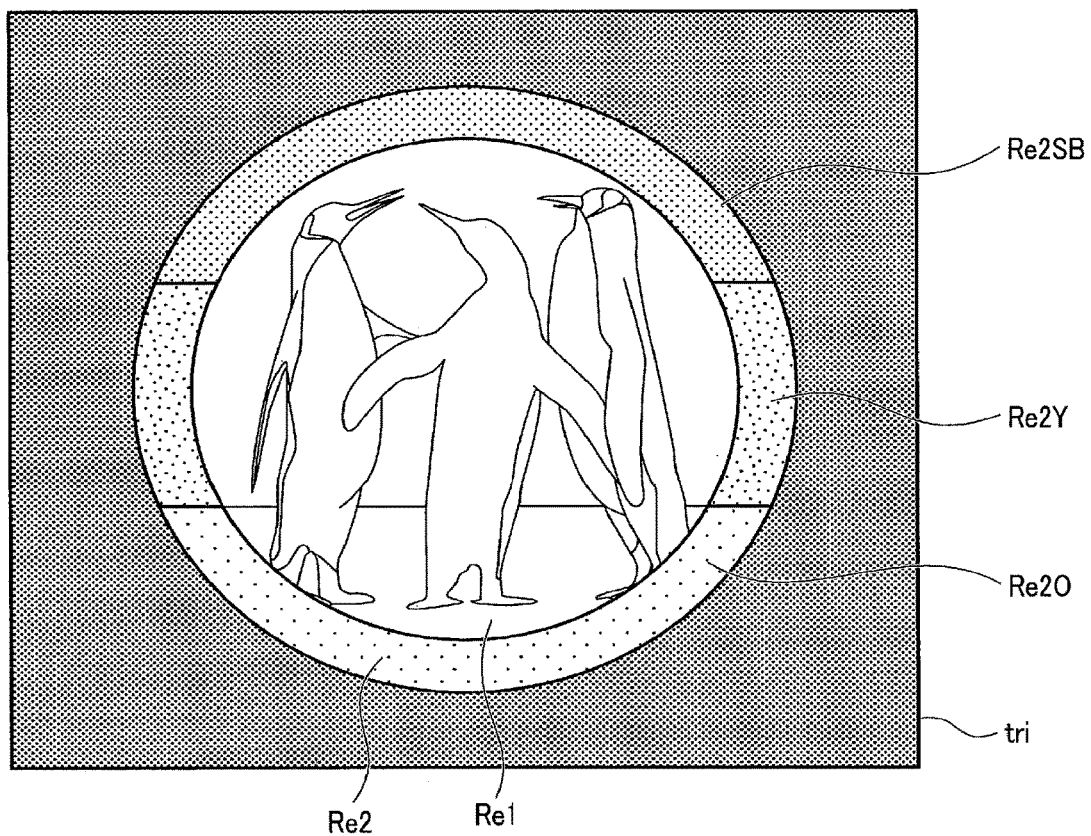
F I G. 15

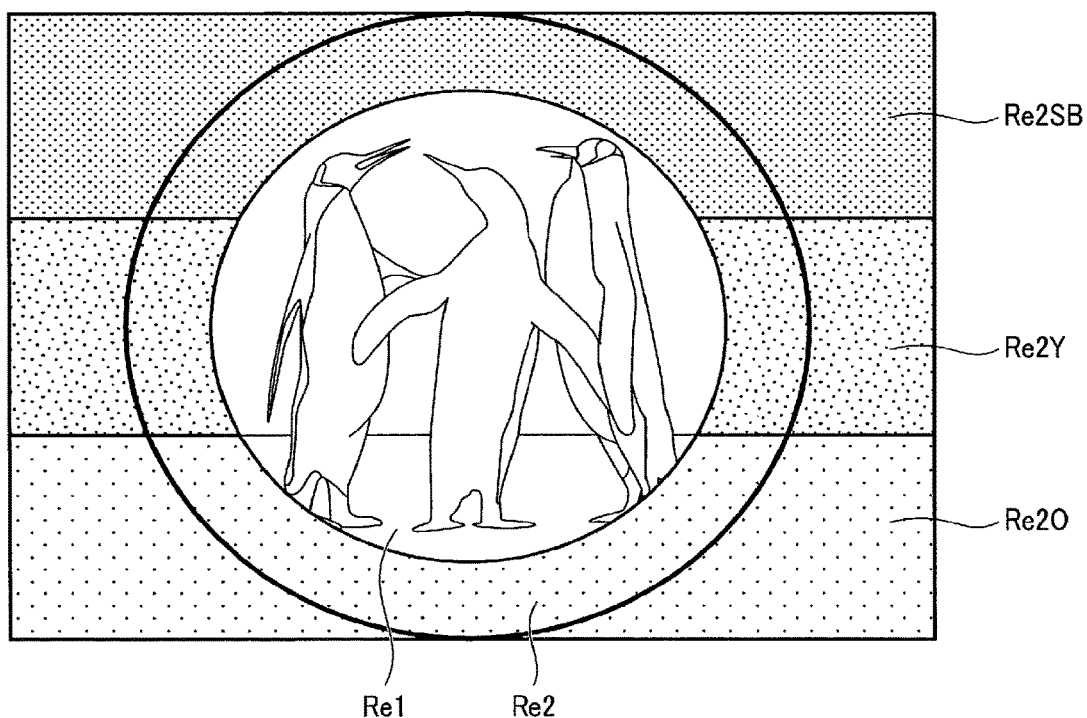
F I G. 16

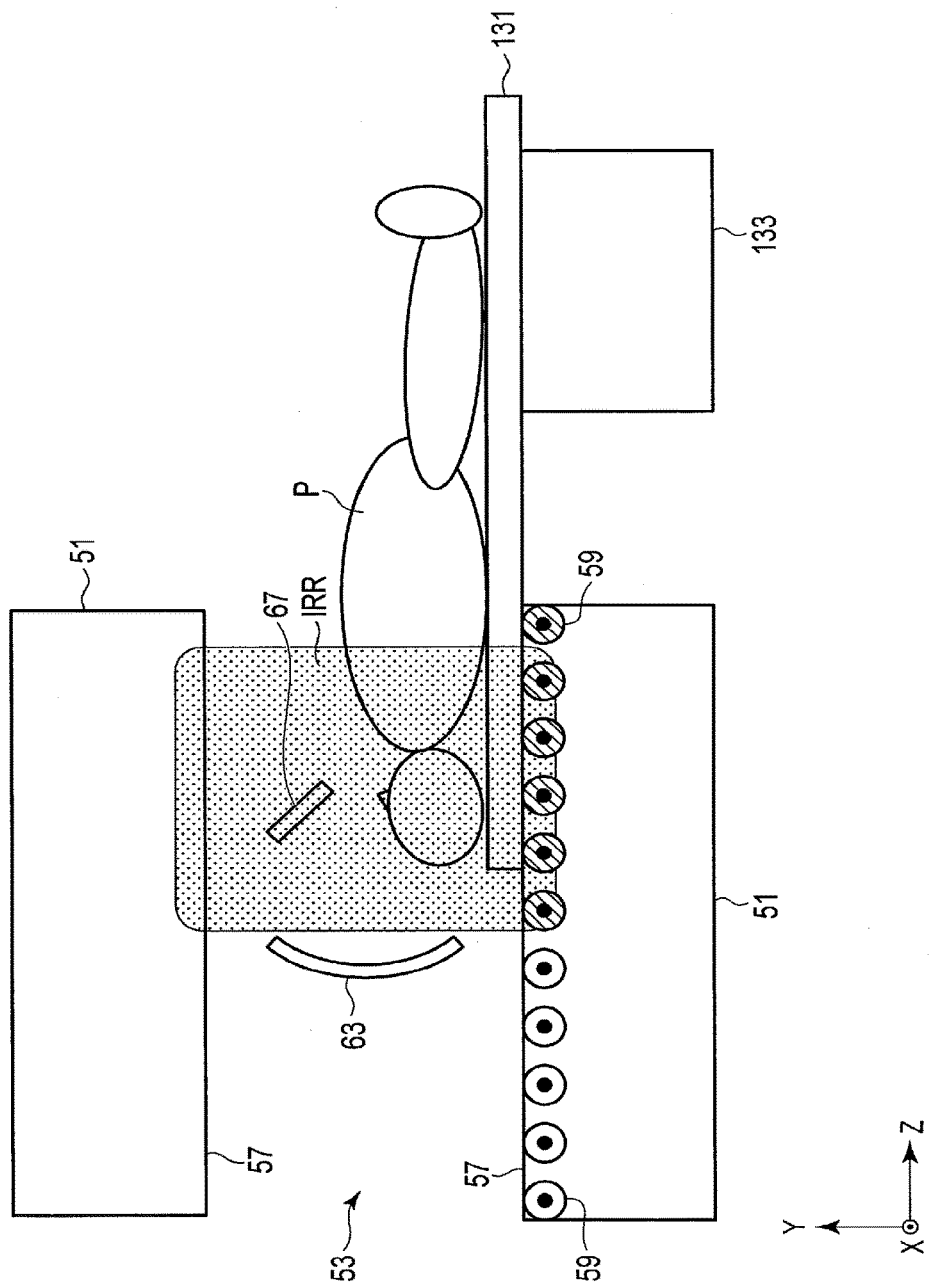
F I G. 26

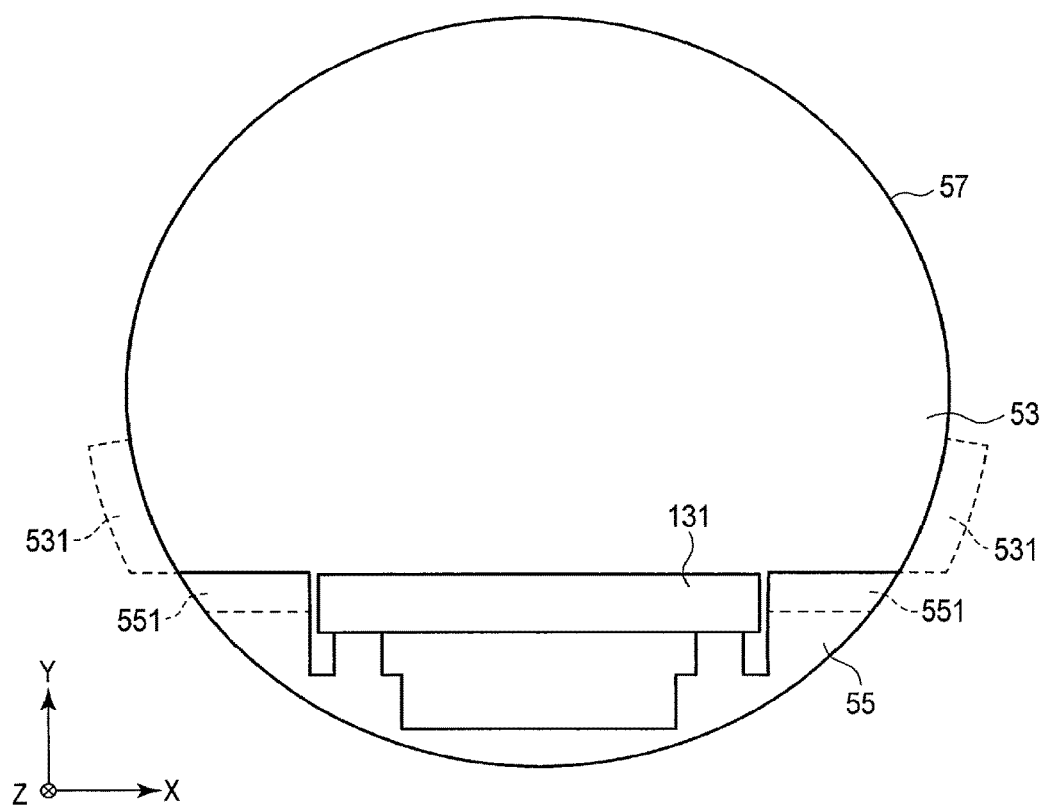
F I G. 27

MEDICAL IMAGE DIAGNOSTIC APPARATUS AND MAGNETIC RESONANCE IMAGING APPARATUS

CROSS-REFERENCE TO RELATED APPLICATIONS

This application is based upon and claims the benefit of priority from the prior Japanese Patent Application No. 2015-214742, filed Oct. 30, 2015, the entire contents of which are incorporated herein by reference.

FIELD

Embodiments described herein relate generally to a medical image diagnostic apparatus and a magnetic resonance imaging apparatus.

BACKGROUND

A magnetic resonance imaging apparatus includes a gantry equipped with an imaging mechanism such as a magnet. A bore having a substantially hollow shape is formed in the gantry. MR (magnetic resonance) imaging is performed in a state in which a patient is inserted inside a bore. A gantry having a relatively large bore diameter has been developed, but not a few patients feel stress against an MR examination due to MR imaging time requires a long period of time, noise during driving of the gantry, and a sense of pressure and a sense of blockage inside a bore.

BRIEF DESCRIPTION OF THE DRAWINGS

FIG. 1 is a diagram illustrating a configuration of a medical image diagnostic system that includes a medical image diagnostic apparatus according to an embodiment of the present invention.

FIG. 2 is a diagram illustrating a configuration of a magnetic resonance imaging apparatus according to the present embodiment.

FIG. 5 is a perspective view of a movable screen apparatus according to the present embodiment.

FIG. 6 is a side view of the movable screen apparatus of FIG. 5.

FIG. 11 is another diagram illustrating a side face of the movable screen apparatus equipped with the sliding mechanism according to the present embodiment.

FIG. 13 is a top view of a patient arranged inside the bore according to the present embodiment viewed from top.

FIG. 14 is a diagram illustrating an example of a projected image according to the present embodiment which is visually recognized by the patient or the like.

FIG. 15 is a diagram illustrating an example in which image content is different between a first image and a second image according to a first modification example of the present embodiment.

FIG. 16 is a diagram illustrating an example in which the image content is different between the first image and the second image according to the first modification example of the present embodiment.

FIG. 26 is a diagram illustrating an example of a plurality of irradiators provided on a rail and an irradiation range according to a fifth modification example of the present embodiment.

FIG. 27 is a front view of a bore of a gantry according to the fifth modification example of the present embodiment.

DETAILED DESCRIPTION

Figure 3:
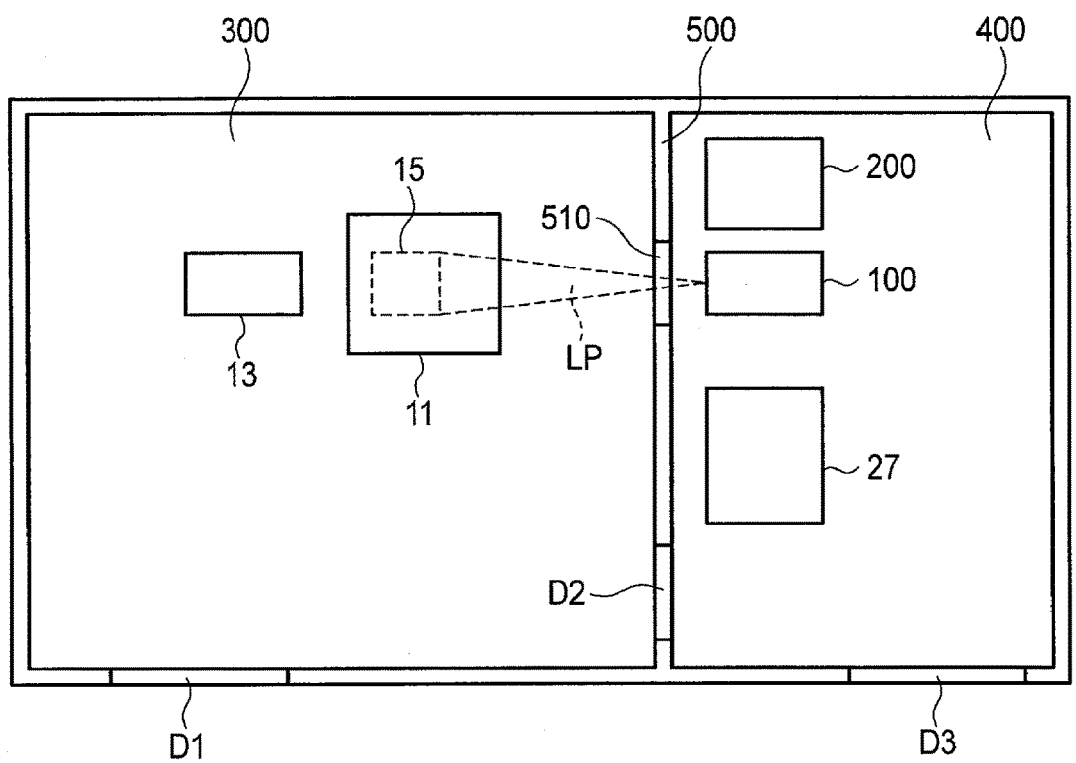
FIG. 3 is a diagram illustrating an example of installation environment of a magnetic resonance imaging system according to the present embodiment.

In general, according to one embodiment, a medical image diagnostic apparatus includes a gantry and a screen. The gantry for medical imaging includes a bore. The screen is insertable into the bore. A predetermined image is projected by a projector on the screen. The screen forms a shape that enables light generated by the projector to arrive at an inner wall of the gantry.

The following technique is considered as a technique to mitigate stress during an MR examination. Examples of the technique include: 1. a goggle-type head-mounted display; 2. installation of a liquid crystal monitor on a ceiling or wall of an examination room; and 3. a head coil attached with a mirror to show an image on a liquid crystal monitor arranged at the rear side of a gantry. However, a patient feels a sense of pressure and a sense of blockage as the head-mounted display is attached to the patient in the case of Technique 1. It is difficult to view an image on the liquid crystal monitor if a patient's head enters a gantry in the case of Technique 2. It is possible to view the image through the mirror mounted to the head coil during MR imaging, and thus, it is possible to mitigate the sense of blockage inside the bore in the case of Technique 3. However, it is necessary to attach the mirror to each head coil. In addition, the mirror is attached to a gap between the head coils covering the head, and thus, the patient hardly feels an extent of the image. In addition, the liquid crystal monitor is installed at the rear side of the gantry and does not hide the front of the gantry, and thus, the patient can visually recognize the bore easily when being outside the gantry before the MR imaging, and hardly dispels a sense of being inside the bore even if watching the image through the mirror using a head coil after then. Further, a positional relationship between the mirror and the liquid crystal monitor is changed along with movement of a couch top, and thus, the patient still feels a sense of passing inside the bore even when viewing the image on the liquid crystal monitor through the mirror during the movement of the couch top.

Further, an image of the liquid crystal monitor is reflected only in a range of the mirror in the case of Technique 3, and thus, it is difficult to sufficiently satisfy a viewing angle range of the patient with the video. In addition, structures that support an RF coil and the mirror or the like are incorporated in a region except for the image within the viewing angle range of the patient, and thus, this technique is insufficient to provide an examination space that improves anxiety of the patient during an examination and relaxes the patient. In particular, there is a case in which the patient having claustrophobia or the like feels anxiety against a narrow bore space itself in the magnetic resonance imaging apparatus.

Hereinafter, a description will be given regarding a medical image diagnostic apparatus and a magnetic resonance imaging apparatus according to the present embodiment with reference to the drawings.

FIG. 1 is a diagram illustrating a configuration of a medical image diagnostic system 1 that includes a medical image diagnostic apparatus 10 according to the present embodiment. As illustrated in FIG. 1, the medical image diagnostic system 1 includes the medical image diagnostic apparatus 10, a projector 100, and a projector control apparatus 200 which are connected in a wired or wireless manner to be capable of communicating with each other. The medical image diagnostic apparatus 10 includes a gantry 11, a couch 13, a movable screen apparatus 15, and an imaging control unit 17. For example, the gantry 11, the couch 13, and the movable screen apparatus 15 are installed in the examination room, and the imaging control unit 17 is installed in a control room adjacent to the examination room. The gantry 11 is equipped with a mechanism configured to realize medical imaging. A bore having a hollow shape is formed in the gantry 11. That is, the gantry 11 for medical imaging includes the bore. The couch 13 is installed at the front side of the gantry 11. The couch 13 supports a couch top on which a patient P is placed to be movable. The couch 13 moves the couch top according to control through the gantry 11, a console and the like. The movable screen apparatus 15 is movably provided in the bore of the gantry 11. The projector 100 is installed at the front side or the rear side of the gantry 11. An image from the projector 100 is projected on the movable screen apparatus 15.

The projector control apparatus 200 is a computer apparatus that controls the projector 100. The projector control apparatus 200 supplies data relating to the image as a projection target to the projector 100. The projector 100 projects the image corresponding to the data supplied from the projector control apparatus 200 on a screen of the movable screen apparatus 15. For example, a liquid crystal system, a digital light processing (DLP) system, a liquid crystal on silicon (LCOS) system, a grating light valve (GLV) system, or the like is preferably used as the projector 100. In this case, at least a display device and a light source are mounted to the projector 100. The display device displays the image corresponding to the data supplied from the projector control apparatus 200. The light source irradiates the display device with light directly or indirectly via an optical system. The light (hereinafter, referred to as projected light) passing through or reflected by the display device is emitted to the outside of the projector 100 directly or indirectly via the optical system. When the movable screen apparatus 15 is irradiated with the projected light, the image corresponding to the projected light is projected on the movable screen apparatus 15.

The imaging control unit 17 functions as a hub of the medical image diagnostic apparatus 10. For example, the imaging control unit 17 controls the gantry 11 in order to perform the medical imaging. In addition, the imaging control unit 17 reconstructs a medical image relating to the patient P based on raw data collected by the gantry 11 in the medical imaging. Incidentally, the imaging control unit 17 may be configured to be capable of controlling the projector 100 via the projector control apparatus 200. In addition, the imaging control unit 17 supplies data relating to an image as a projection target to the projector 100. In this case, the projector 100 projects the image corresponding to the data supplied from the imaging control unit 17 on the screen of the movable screen apparatus 15.

Incidentally, the configuration of the medical image diagnostic system 1 according to the present embodiment is not limited only to the above-described configuration. For example, the projector control apparatus 200 is not necessarily provided in the medical image diagnostic system 1 as long as the imaging control unit 17 has the above-described function of controlling the projector 100 according to the projector control apparatus 200.

The medical image diagnostic system 1 according to the present embodiment can enhance dwelling ability inside the bore during the medical imaging according to the medical image diagnostic apparatus 10 by utilizing the projector 100 and the movable screen apparatus 15. An apparatus that can image the patient P using the gantry 11 in which the bore is formed may be used as the medical image diagnostic apparatus 10 according to the present embodiment. To be specific, a single modality such as a magnetic resonance imaging (MRI) apparatus, an X-ray computed tomography (CT) apparatus, a positron emission tomography (PET) apparatus, and a single photon emission computed tomography (SPECT) apparatus can be applied as the medical image diagnostic apparatus 10 according to the present embodiment. Alternatively, a combined modality such as an MR/PET apparatus, a CT/PET apparatus, an MR/SPECT apparatus, and a CT/SPECT apparatus may be applied as the medical image diagnostic apparatus 10 according to the present embodiment. However, the medical image diagnostic apparatus 10 according to the present embodiment is assumed to be a magnetic resonance imaging apparatus 10 in order to give the following description in detail. In addition, the medical image diagnostic system 1, which includes the magnetic resonance imaging apparatus 10, the projector 100, and the projector control apparatus 200, will be referred to as a magnetic resonance imaging system 1.

FIG. 2 is a diagram illustrating a configuration of the magnetic resonance imaging apparatus 10 according to the present embodiment. As illustrated in FIG. 2, the magnetic resonance imaging apparatus 10 includes the imaging control unit 17, the gantry 11, the couch 13, and the movable screen apparatus 15. The imaging control unit 17 includes a gradient power supply 21, a transmitting circuitry 23, a receiving circuitry 25, and a console 27. The console 27 includes an imaging control circuitry 31, a reconstruction circuitry 32, an image processing circuitry 33, a communication circuitry 34, a display circuitry 35, an input circuitry 36, a main memory circuitry 37, and a system control circuitry 38. The imaging control circuitry 31, the reconstruction circuitry 32, the image processing circuitry 33, the communication circuitry 34, the display circuitry 35, the input circuitry 36, the main memory circuitry 37, and the system control circuitry 38 are connected to be capable of communicating with each other via a bus. The gradient power supply 21, the transmitting circuitry 23, and the receiving circuitry 25 are provided separately from the console 27 and the gantry 11. As illustrated in FIG. 2, the projector is not included in the magnetic resonance imaging apparatus 10.

The gantry 11 includes a static magnetic field magnet 41, a gradient magnetic field coil 43, and an RF coil 45. In addition, the static magnetic field magnet 41 and the gradient magnetic field coil 43 are housed in a housing (hereinafter, referred to as a gantry housing) 51 of the gantry 11. A bore 53 having a hollow shape is formed in the gantry housing 51. The RF coil 45 is arranged inside the bore 53 of the gantry housing 51. In addition, the movable screen apparatus 15 according to the present embodiment is arranged inside the bore 53 of the gantry housing 51.

The static magnetic field magnet 41 has a substantially cylindrical shape with hollow and generates a static magnetic field in a substantially cylindrical inner portion. For example, a permanent magnet, a superconducting magnet, a normal conducting magnet, or the like is used as the static magnetic field magnet 41. Herein, a central axis of the static magnetic field magnet 41 is defined as a Z-axis, and an axis which is vertically orthogonal to the Z-axis is referred to as a Y-axis, and an axis which is horizontally orthogonal to the Z-axis is referred to as an X-axis. The X-axis, the Y-axis, and the Z-axis form a three-dimensional coordinate system orthogonal to each other.

The gradient magnetic field coil 43 is a coil unit which is attached to an inner side of the static magnetic field magnet 41 and is formed in a substantially cylindrical shape with a hollow. The gradient magnetic field coil 43 receives supply of current from the gradient power supply 21 and generates a gradient magnetic field.

The gradient power supply 21 supplies the current to the gradient magnetic field coil 43 according to control of the imaging control circuitry 31. The gradient power supply 21 causes the gradient magnetic field coil 43 to generate the gradient magnetic field by supplying the current to the gradient magnetic field coil 43.

The RF coil 45 is arranged at an inner side of the gradient magnetic field coil 43 and generates a high frequency magnetic field by receiving supply of a RF pulse from the transmitting circuitry 23. In addition, the RF coil 45 receives a magnetic resonance signal (hereinafter, referred to as an MR signal), which is emitted from a target atomic nucleus present inside the patient P by receiving action of the high frequency magnetic field. The received MR signal is supplied to the receiving circuitry 25 in a wired or wireless manner. Incidentally, the above-described RF coil 45 is configured as a coil having the transmission and reception functions, but an RF coil for transmission and an RF coil for reception may be provided separately.

The transmitting circuitry 23 transmits the high frequency magnetic field for excitation of the target atomic nucleus present inside the patient P to the patient P via the RF coil 45. Typically, proton is used as the target atomic nucleus. To be specific, the transmitting circuitry 23 supplies a high frequency signal (RF signal) for excitation of the target atomic nucleus to the RF coil 45 according to control of the imaging control circuitry 31. The high frequency magnetic field generated from the RF coil 45 oscillates with a unique resonant frequency with respect to the target atomic nucleus and excites the target atomic nucleus. The MR signal is generated from the excited target atomic nucleus, and is detected by the RF coil 45. The detected MR signal is supplied to the receiving circuitry 25.

The receiving circuitry 25 receives the MR signal, generated from the excited target atomic nucleus via the RF coil 45. The receiving circuitry 25 performs signal processing of the received MR signal to generate a digital MR signal. The digital MR signal is supplied to the reconstruction circuitry 32 in a wired or wireless manner.

The couch 13 is installed to be adjacent to the gantry 11. The couch 13 includes a couch top 131 and a base 133. The patient P is loaded on the couch top 131. The base 133 supports the couch top 131 to be slidable along each of the X-axis, the Y-axis, and the Z-axis. A couch driving device 135 is housed in the base 133. The couch driving device 135 receives the control of the imaging control circuitry 31 and moves the couch top 131. Any motor such as a servomotor and a stepping motor may be used as the couch driving device 135.

The imaging control circuitry 31 includes a processor such as a central processing unit (CPU) or a micro processing unit (MPU) and a memory such as a read only memory (ROM) and a random access memory (RAM) as hardware resources. The imaging control circuitry 31 controls the gradient power supply 21, the transmitting circuitry 23, and the receiving circuitry 25 in a synchronous manner based on pulse sequence information supplied from the system control circuitry 38, and images the patient P at a pulse sequence according to the pulse sequence information.

The reconstruction circuitry 32 includes a processor such as a CPU, a graphical processing unit (GPU), and an MPU and a memory such as a ROM and a RAM as hardware resources. The reconstruction circuitry 32 reconstructs an MR image relating to the patient P based on the MR signal supplied from the receiving circuitry 25. For example, the reconstruction circuitry 32 generates the MR image which is defined in a real space by performing the Fourier transform or the like on the MR signal arranged in a k-space or a frequency space. Incidentally, the reconstruction circuitry 32 may be realized by an application specific integrated circuit (ASIC), a field programmable logic apparatus (FPGA), another complex programmable logic device (CPLD), a simple programmable logic device (SPLD) that realizes the reconstruction function.

The image processing circuitry 33 includes a processor such as a CPU, a GPU, and an MPU and a memory such as a ROM and a RAM as hardware resources. The image processing circuitry 33 performs various types of image processing with respect to the MR image reconstructed by the reconstruction circuitry 32. Incidentally the image processing circuitry 33 may be realized by an ASIC, an FPGA, a CPLD or an SPLD that realizes the above-described image processing function.

The communication circuitry 34 performs data communication with the projector control apparatus 200 or the projector 100 via a wire (not illustrated) or in a wireless manner. In addition, the communication circuitry 34 may perform data communication with an external apparatus such as a PACS server connected via network or the like (not illustrated). In addition, the communication circuitry 34 may perform data communication with a device to be described later which is attached to the movable screen apparatus 15.

The display circuitry 35 displays various types of information. For example, the display circuitry 35 displays the MR image reconstructed by the reconstruction circuitry 32 or the MR image after being subjected to the image processing by the image processing circuitry 33. In addition, the display circuitry 35 may display the image projected by the projector 100. To be specific, the display circuitry 35 includes a display interface circuit and a display device. The display interface circuit converts data representing a display target to a video signal. The display signal is supplied to the display device. The display device displays the video signal representing the display target. For example, a CRT display, a liquid crystal display, an organic EL display, an LED display, a plasma display, or any arbitrary display which has been known in the technical field can be suitably used as the display device.

To be specific, the input circuitry 36 includes an input device and an input interface circuit. The input device receives various instructions from a user. A keyboard, a mouse, various switches, and the like can be used as the input device. The input interface circuit supplies an output signal from the input device to the system control circuitry 38 via a bus. Incidentally, the input circuitry 36 is not limited to one provided with physical operating parts such as a mouse and a keyboard. Examples of the input circuitry 36 include a processing circuit of an electrical signal that receives the electrical signal corresponding to an input operation from an external input device, provided separately from the magnetic resonance imaging apparatus 10, and outputs the received electrical signal to various circuits.

The main memory circuitry 37 is a storage apparatus that stores various types of information such as a hard disk drive (HDD), a solid state drive (SSD), and an integrated circuit storage apparatus. In addition, the main memory circuitry 37 may be a driving device that reads and writes various types of information with respect to a portable recording medium such as a CD-ROM drive, a DVD drive, and a flash memory. For example, the main memory circuitry 37 stores the MR image, a control program of the magnetic resonance imaging apparatus 10, and the like.

The system control circuitry 38 includes a processor such as a CPU and an MPU and a memory such as a ROM and a RAM as hardware resources. The system control circuitry 38 functions as a hub of the magnetic resonance imaging apparatus 10. To be specific, the system control circuitry 38 reads the control program stored in the main memory circuitry 37, develops the control program on the memory, and controls each unit of the magnetic resonance imaging apparatus 10 according to the developed control program.

Hereinafter, the magnetic resonance imaging apparatus 10 according to the present embodiment will be described in detail.

First, a description will be given regarding an installation environment of the magnetic resonance imaging system according to the embodiment 1 with reference to FIG. 3. FIG. 3 is a diagram illustrating an example of installation environment of a magnetic resonance imaging system according to the present embodiment. As illustrated in FIG. 3, an examination room 300 in which the MR imaging is performed and a control room 400 which is adjacent to the examination room 300 are provided. The gantry 11 and the couch 13 are installed in the examination room 300. The couch 13 is provided at the front side of the gantry 11. The movable screen apparatus 15 is provided in the bore of the gantry 11. The examination room 300 is a shielded room that can shield a leaked magnetic field from the gantry 11, an electromagnetic field from the outside, and the like. A door D1, configured to allow entrance and exit, is provided in the examination room 300. In addition, a door D2, configured to allow coming and going between the examination room 300 and the control room 400, is provided between the examination room 300 and the control room 400. The console 27, the projector 100, and the projector control apparatus 200 are installed in the control room 400. The projector 100 is installed at the rear side of the gantry 11 being spaced apart from a wall 500 between the examination room 300 and the control room 400. A window 510 through which a projected light LP is transmitted is provided in a portion of the wall 500 in which a projected light LP from the projector 100 toward the movable screen apparatus 15 is propagated. It is possible to propagate the projected light LP from the projector 100 installed in the control room 400 to the movable screen apparatus 15 of the examination room 300 via the window 510. It is preferable to provide a door D3, configured to allow entrance and exit, in the control room 400.

Incidentally, the above-described layout is illustrative, and the present invention is not limited thereto. For example, the console 27 and the projector control apparatus 200 may be installed in another room differently form the projector 100 although the projector 100, the projector control apparatus 200, and the console 27 are installed in the control room 400 in the above-described layout. In addition, the projector 100 may be provided in the examination room 300 as long as the projector 100 can be formed using a material that is not affected by a magnetic field. In addition, a machine room or the like, which is configured to install the gradient power supply 21 and the receiving circuitry 25 therein, may be provided in addition to the examination room 300 and the control room 400.

Figure 4:
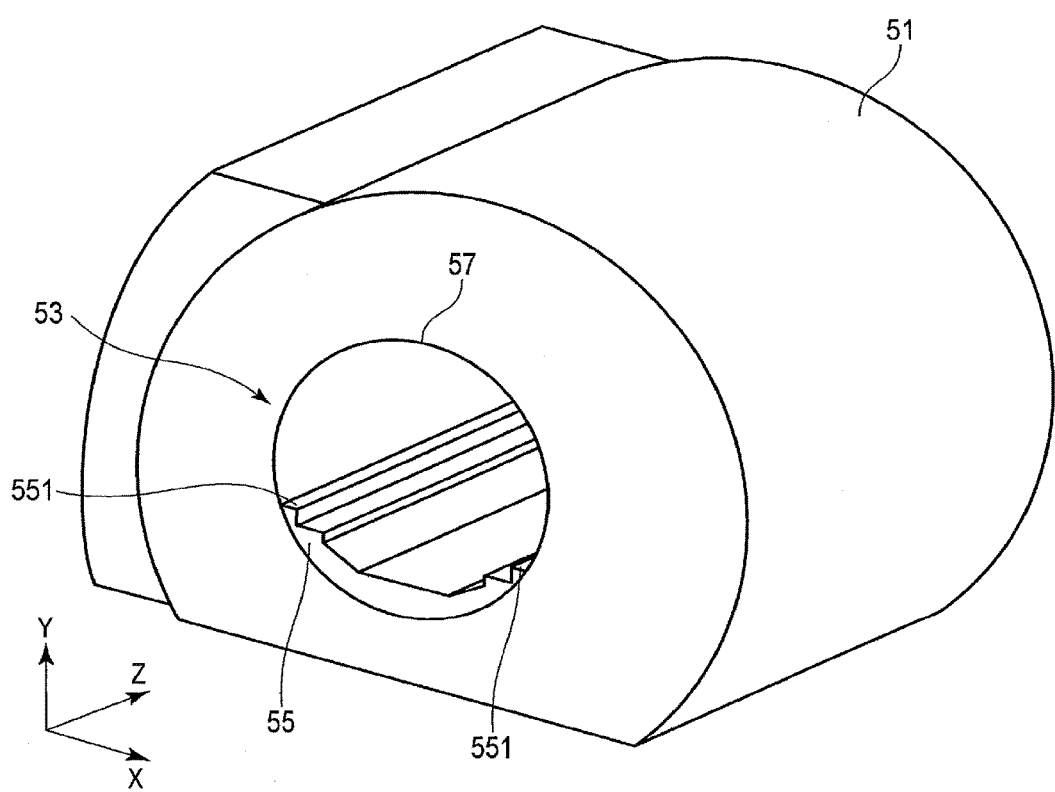
FIG. 4 is a perspective view of a gantry housing according to the present embodiment.

Next, an exterior appearance of the gantry 11 will be described with reference to FIG. 4. FIG. 4 is a perspective view of the gantry housing 51 according to the present embodiment. As illustrated in FIG. 4, the hollow bore 53 is formed in the gantry housing 51. A rail 55, which is parallel to the central axis Z of the bore 53, is formed below the bore 53 of the gantry housing 51. The rail 55 is a structure that guides slide of the couch top 131 and the movable screen apparatus 15 along the central axis Z. The rail 55 is provided on an inner wall 57 of the gantry housing 51 which is in contact with the bore 53. The rail 55 is formed using a non-magnetic material that does not act with a magnetic field used for the magnetic resonance imaging. Herein, a direction from the couch side toward the projector side in relation to the Z-axis is defined as a positive Z-axis direction and a direction from the projector side toward the couch side is defined as a negative Z-axis direction.

Figure 7:
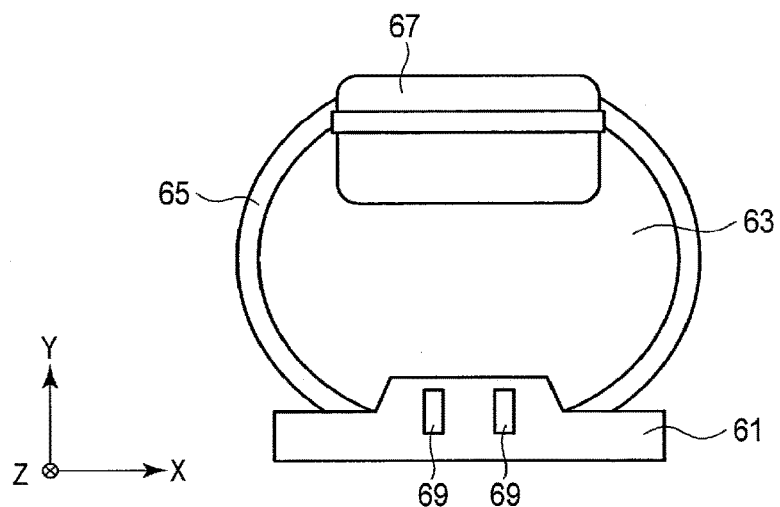
FIG. 7 is a front view of the movable screen apparatus of FIG. 5.
Figure 8:
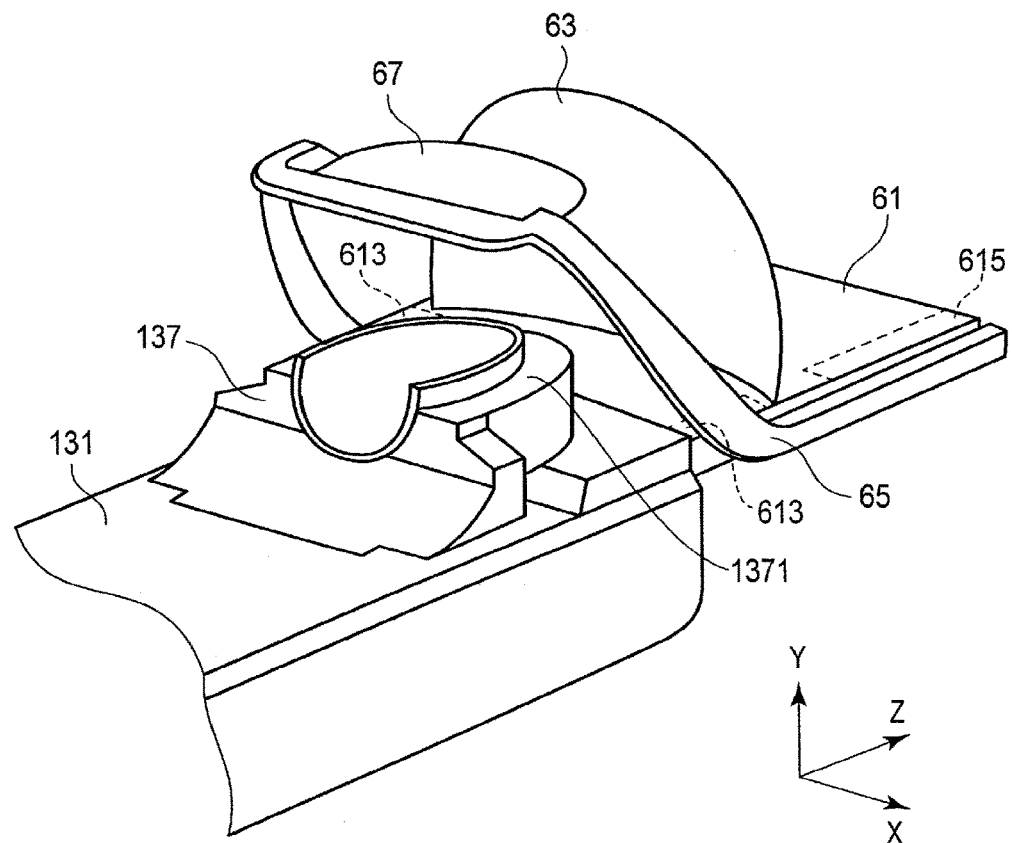
FIG. 8 is a perspective view of the movable screen apparatus and a couch top, which are coupled with each other, according to the present embodiment.

Next, a structure of the movable screen apparatus 15 will be described with reference to FIGS. 5 to 8. FIG. 5 is a perspective view of the movable screen apparatus 15 according to the present embodiment. FIG. 6 is a side view of the movable screen apparatus 15. FIG. 7 is a front view of the movable screen apparatus 15. FIG. 8 is a perspective view of the movable screen apparatus 15 and the couch top 131 which are couple with each other.

As illustrated in FIGS. 5 to 8, the movable screen apparatus 15 includes a movable carriage 61, a screen 63, a support arm 65, and a reflecting plate 67. The movable carriage 61 is a structural body that moves along the rail 55 provided on the inner wall 57 of the gantry housing 51. A wheel (not illustrated) to roll the rail 55 is attached to a lower part of the movable carriage 61 in order to enhance a traveling property of the rail 55. Incidentally, the wheel is not necessarily provided as long as the movable carriage 61 can travel along the rail 55, and a face in contact with the rail 55 may be formed using a material having a low coefficient of friction. The movable carriage 61 and the rail 55 are formed to enable the movable carriage 61 to move from an end of the bore 53 on the couch 13 side (the negative Z-direction) to an end thereof on the projector 100 side (the positive Z-direction). A bottom face of the movable carriage 61 preferably has a shape that can be fit with the rail 55. When the movable carriage 61 and the rail 55 are engaged with each other, it is possible to make the rail 55 unnoticeable when the gantry 11 is viewed from the outside in a state in which the movable carriage 61 is arranged at the end of the bore 53. The movable carriage 61 supports the screen 63 and the support arm 65. The movable carriage 61 is formed using a non-magnetic material that does not act with a magnetic field such as resin.

As illustrated in FIG. 5, a coupling portion 69, configured for coupling with the couch top 131, is formed in the movable carriage 61. As illustrated in FIG. 8, the movable carriage 61 and the couch top 131 are coupled using the coupling portion 69. A patient fixing tool 137 is attached to a front portion (side in the positive Z-axis direction) of the couch top 131. The patient fixing tool 137 fixes a head of the patient P loaded on the couch top 131. The patient fixing tool 137 has a curved shape so as to be capable of covering an occipital part without interrupting the field of view of the patient P loaded on the back on the couch top 131. That is, a sincipital-part side of the patient fixing tool 137 is opened. Accordingly, the patient fixing tool 137 can mitigate the sense of blockage of the patient P, and further, mitigate constriction of the field of view of the patient P as compared to a fixing portion that covers the entire head. The patient fixing tool 137 is integrally molded using a non-magnetic material such as resin using a mold having the above-described shape, for example.

As illustrated in FIGS. 5 to 8, the screen 63 is installed upright on the movable carriage 61. The image from the projector 100 (not illustrated) is projected on the screen 63.

The screen 63 is provided to be tiltable with respect to the movable carriage 61. To be specific, the movable carriage 61 is provided to be tiltable by a tilting mechanism (not illustrated) provided therein. The screen 63 is held to be perpendicular or have a predetermined gradient angle with respect to a front surface of the movable carriage 61 by adjusting a tilted angle of the screen 63 with respect to the front surface of the movable carriage 61. As described above, the projector 100 is arranged on the opposite side of the couch 13 with the screen 63 interposed therebetween. Herein, a face of the screen 63 on the projector 100 side is referred to as a rear surface, and a face thereof on the couch 13 side is referred to as the front surface. The screen 63 is preferably formed using a semitransparent material in order to allow the image to be projected on the front surface thereof. Semitransparent plastic, ground glass, or the like is preferably used as such a semitransparent material. When the screen 63 is formed using the semitransparent material, the rear surface of the screen is irradiated with the projected light emitted from the projector 100, and the image corresponding to the projected light is projected on the front surface. Accordingly, the patient P or the like can view the image, which is projected on the front surface, from the couch 13 side. The screen 63 may be a model having a planar shape or a model having a curved shape. The screen 63 is preferably arranged such that a concave face thereof is directed to the couch 13 side, that is, forms the front surface in the case of having the curved shape. When the concave face is directed to the couch 13 side, it is possible to cover the periphery of the rear side of the head of the patient P loaded on the couch top 131 with the screen 63. Accordingly, it is possible to make the field of view of the patient P to be filled with the image projected on the screen 63 such that the patient P is immersed in the image.

Figure 9:
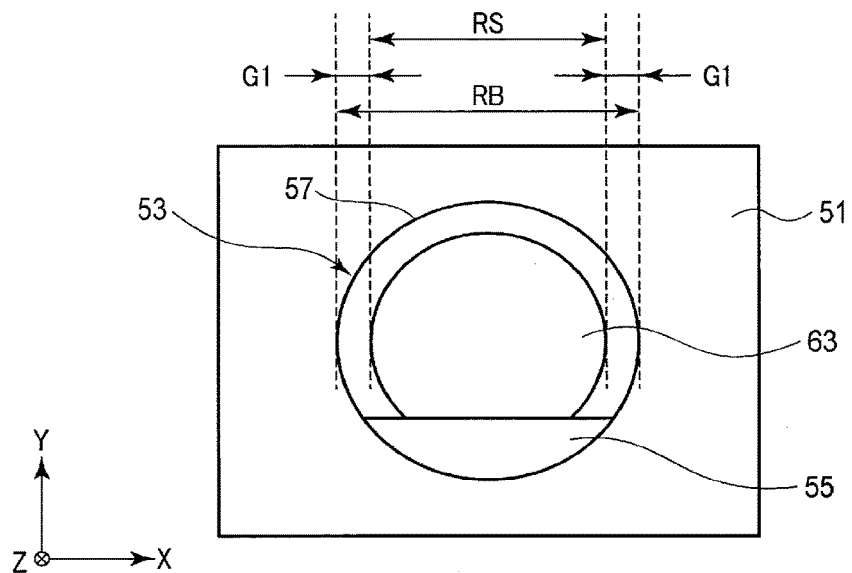
FIG. 9 is a diagram illustrating a front view of a screen which is arranged inside a bore according to the present embodiment.

FIG. 9 is a diagram schematically illustrating a front face of the screen 63 which is arranged inside the bore 53. As illustrated in FIG. 9, the screen 63 has an outer diameter RS which is smaller than a diameter RB of the inner wall 57 in contact with the bore 53 of the gantry housing 51. When the outer diameter RS is designed to be smaller than the inner diameter RB in this manner, it is possible to insert the movable screen apparatus 15 inside the bore 53. Incidentally, a wind flows inside the bore 53 from a ventilation fan (not illustrated) provided in the gantry 11. When a gap G1 is provided between an edge of the screen 63 and the inner wall 57, it is possible to prevent the wind blown out from the ventilation fan from being interrupted by the screen 63. The outer diameter RS is preferably designed to be smaller than the inner diameter RB by, for example, 10 mm to 50 mm. In other words, the gap G1 is preferably designed to be 10 mm to 50 mm.

As illustrated in FIGS. 5 to 8, the support arm 65 is attached to the movable carriage 61. As will be described below, the support arm 65 is attached to the movable carriage 61 to be slidable in the Z-axis direction. The support arm 65 supports the reflecting plate 67 to be arranged in a space on the front surface side of the screen 63. The reflecting plate 67 is spaced apart from the front surface of the movable carriage 61 to a degree that prevents collision with the head of the patient P loaded on the couch top 131 in a state in which the movable carriage 61 and the couch top 131 are coupled with each other, and is supported by the support arm 65. The support arm 65 has a shape that prevents the field of view of an external observer from being interrupted when the screen 63 is viewed from the outside of the gantry 11. The support arm 65 preferably has a semi-ring shape or a semi-saddle shape which includes an arcuate portion along a contour of the screen 63 in order not to interrupt the field of view of the external observer as illustrated in FIGS. 5 to 8. In this case, both ends of the support arm 65 are attached to the side portion of the movable carriage 61, and the support arm 65 is attached to the movable carriage 61 such that the arcuate portion of the support arm 65 is positioned in the space on the front surface side of the screen 63. Incidentally, the shape of the support arm 65 is not limited to the above-described semi-ring or semi-saddle shape, but may have any shape as long as the reflecting plate 67 can be arranged in the space on the front surface side of the screen 63. For example, the support arm 65 may be configured using a pair of arms each of which has substantially a rod shape. In this case, it is preferable when one end of the pair of arms is attached to both side portions of the movable carriage 61 and the other end thereof is attached to the reflecting plate 67.

As illustrated in FIGS. 5 to 8, the reflecting plate 67 is provided at a substantially uppermost part of the support arm 65. The reflecting plate 67 reflects the image projected on the front surface of the screen 63. The reflecting plate 67 is formed using a non-magnetic material and may be formed using any material as long as it is possible to optically reflect a target. For example, a mirror obtained by performing aluminum vapor-deposition on acryl, a half mirror to which a dielectric film adheres, and the like may be used as the reflecting plate 67. The patient P whose head is arranged on the patient fixing tool 137 can view the image projected on the front surface through the reflecting plate 67.

The reflecting plate 67 is rotatably provided in the support arm 65 such that the patient P can manually adjust an angle of the reflecting plate 67. To be specific, the reflecting plate 67 is provided to be rotatable about a rotation shaft RR1 by a rotating mechanism (not illustrated) which is provided in the support arm 65. The rotation shaft RR1 is provided to be parallel to the X-axis so as to be capable of adjusting a direction of the reflecting plate 67 with respect to the front surface of the screen 63, for example. To be more specific, the support arm 65 may be provided at least to be switchable between a first angle configured for a first projection format and a second angle configured for a second projection format which will be described later. The first projection format is a format to view the image of the screen 63 without the intervention of the reflecting plate 67 from the outside of the gantry 11. Thus, the first angle of the reflecting plate 67 according to the first projection format is preferably set to be, for example, substantially horizontal to an angle that does not interrupt the field of view of the patient P or the like present at the outside of the gantry 11. The second projection format is a format to view the image through the reflecting plate 67 inside the bore 53. Thus, the second angle of the reflecting plate according to the second projection format is preferably set to be an arbitrary angle between horizontal and vertical depending on physique of the patient P serving as an observer.

Figure 10:
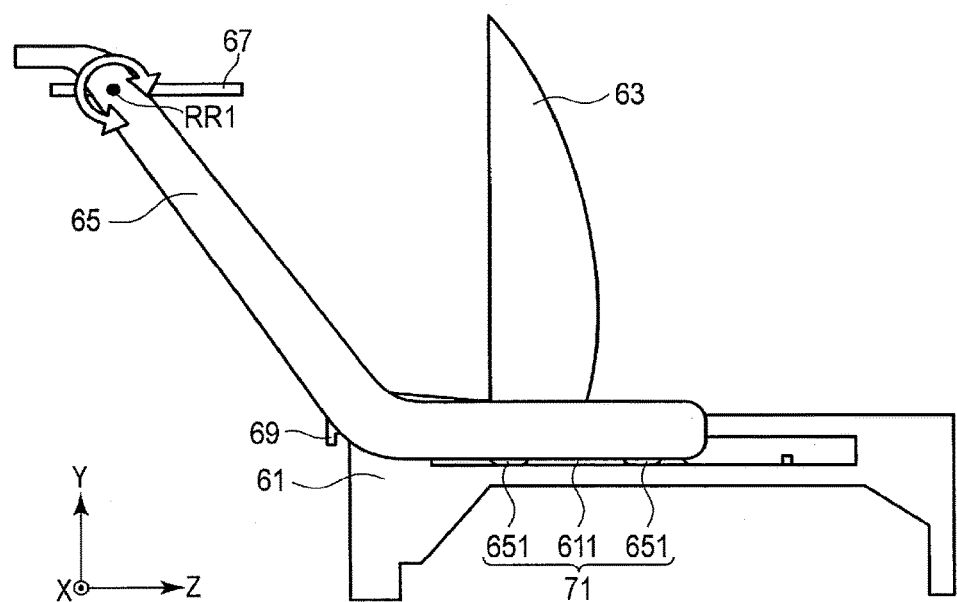
FIG. 10 is a diagram illustrating a side face of the movable screen apparatus equipped with a sliding mechanism according to the present embodiment.

A sliding mechanism 71 of the support arm 65 is preferably provided in the movable carriage 61 in order to adjust the position of the reflecting plate 67 in relation to the Z-axis. FIG. 10 is a diagram illustrating a side face of the movable screen apparatus 15 of which the support arm 65 in FIG. 6 is slid in relation to the Z-axis. As illustrated in FIGS. 6 and 10, a guide 611, which guides the slide of the support arm 65 along the Z-axis, is formed on the movable carriage 61 in the sliding mechanism 71. The guide 611 is provided along the Z-axis on both the side faces of the movable carriage 61 in order to avoid contact with the support arm 65 and the screen 63. The guide 611 may be realized in any mode, and, for example, is realized by a void provided on the side face of the movable carriage 61 along the Z-axis. As illustrated in FIGS. 6 and 11, a wheel 651 is preferably provided in a base portion of the support arm 65 facing the guide 611 in order to enhance a sliding performance of the support arm 65. When the sliding mechanism 71 is provided, a medical professional such as a doctor, a technician, and a nurse, the patient P and the like can cause the reflecting plate 67 to approach or be spaced apart from the screen 63 by pushing or pulling the support arm 65 in the Z-axis direction. Accordingly, it is possible to adjust the position of the reflecting plate 67 in relation to the Z-axis direction.

Incidentally, the sliding mechanism 71 is realized using the guide 611 provided in the movable carriage 61 and the wheel 651 provided in the support arm 65 in the above description. However, the present embodiment is not limited thereto. Any mechanism may be used as the sliding mechanism 71 according to the present embodiment as long as the support arm 65 is relatively slidable with respect to the movable carriage 61. For example, it may be configured such that a guide is provided in the support arm 65 along the Z-axis, and a wheel to travel the guide is provided in the movable carriage 61. In addition, the sliding mechanism 71 may be realized using a ball screw, a slide rail, or the like.

FIG. 11 is a simple side view of the movable screen apparatus 15 which is arranged inside the bore 53 of the gantry 11. As illustrated in FIG. 11, the movable carriage 61 of the movable screen apparatus 15 is slidably provided in the rail 55. Typically, a driving device is not mounted to the movable screen apparatus 15. The movable screen apparatus 15 slides to be interlocked with slide of the couch top 131 caused by the couch driving device 135. Incidentally, the movable screen apparatus 15 can also slide in relation to the Z-axis by being pushed and pulled by the patient P, a medical professional or the like.

The screen 63 is insertable into the bore 53 and is formed such that the light generated by the projector 100 can arrive at the inner wall 57 of the gantry housing 51 in relation to the bore 53. To be specific, the outer diameter RS of the screen is smaller than an inner diameter RB of the bore 53 as illustrated in FIG. 9. In addition, the light emitted from the projector 100 is emitted to a region including the inner diameter RB of the bore 53. Accordingly, the projection light emitted from the projector 100 is projected on the screen 63 and the inner wall 57 of the gantry housing 51. In other words, a projected image projected from the projector 100 includes a first region projected on the screen 63 and a second region projected on the inner wall 57 of the gantry housing 51 in relation to the bore 53. The projected image may be a moving image or a still image. In addition, the projected image may be a moving image or a still image. In addition, image content of the projected image may be a moving image or a still image having, for example, a relaxation effect, or examination support information such as precautions during an examination and remaining time until examination end time. The light relating to the image for the second region passes through the gap (G1 in FIG. 9) between the bore and the screen. Hereinafter, the above-described content will be described in detail with reference to the drawings.

Figure 12:
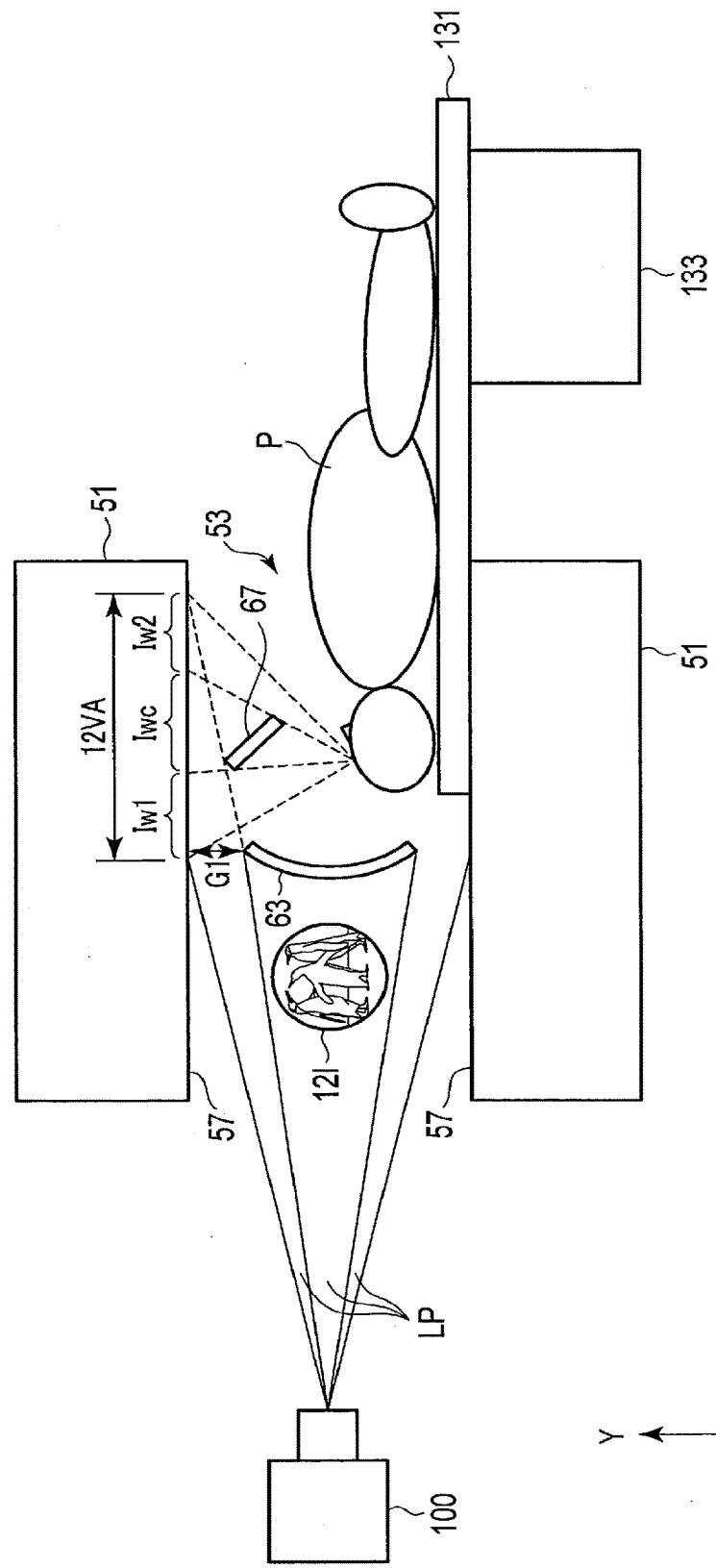
FIG. 12 is a side view illustrating an example of a cross section of the magnetic resonance imaging system according to the present embodiment viewed from a side face thereof.

FIG. 12 is a side view illustrating an example of a cross section of the magnetic resonance imaging system 1 viewed from a side face thereof. As illustrated in FIG. 12, the screen 63 is formed so as to enable the projection light LP emitted from the projector 100 to arrive at the inner wall 57 (a top wall) of the gantry housing 51. Accordingly, the projection light LP is projected on the screen 63 and the inner wall 57 of the gantry housing 51 as illustrated in FIG. 12. An image 12I in FIG. 12 is an image projected on the screen 63 and corresponds to the first region of the projected image.

As illustrated in FIG. 12, the image 12I projected on the screen 63 is arranged in a region (hereinafter, referred to as a center region) Iwc including a center of a viewing angle range 12VA, which is immediately above the patient P, via the reflecting plate 67. In FIG. 12, the projection light LP corresponding to a second region Re2 is the projection light (hereinafter, referred to as leakage light) which has passed through the gap G1 between an edge of the screen 63 and the inner wall 57 of the gantry housing 51. The leakage light arrives at, for example, end portions (Iw1 and Iw2) of the viewing angle range 12VA on the inner wall 57 of the gantry housing 51.

For example, the leakage light arrives at a range (hereinafter, referred to as a leakage light arrival range) from the screen 63 to the vicinity of the shoulder of the patient P in the inner wall 57 of the gantry housing 51. That is, the screen 63 forms the projection light LP such that the leakage light arrives at the leakage light arrival range of the inner wall 57 of the gantry housing 51. The leakage light arrival range depends on a shape of the screen. For example, the leakage light arrival range formed by a screen having a shape is configured of a major arc and a chord and having the chord positioned at an upper end is larger than a leakage light arrival range formed by the screen 63 having a circular shape as illustrated in FIG. 9.

FIG. 13 is a top view of the patient P arranged inside the bore 53 viewed from top. As illustrated in FIG. 13, the screen 63 is formed so as to enable the projection light LP to arrive at the inner wall 57 (a side wall) of the gantry housing 51. The image corresponding to the second region Re2 is projected on the inner wall corresponding to the viewing angle range 13VA at the side face of the patient P. The leakage light arrival range corresponding to the viewing angle range 13VA in FIG. 13 is determined depending on the gap (G1 in FIG. 9), which is a difference between the outer diameter RS of the screen 63 and the inner diameter RB of the bore 53 of the gantry housing 51 and depending on a distance from the projector 100 to the screen 63. A range indicated by LLAR in FIG. 13 corresponds to the leakage light arrival range.

FIG. 14 is a diagram illustrating an example of the projected image which is visually recognized by the patient P or the like. In FIG. 14, an inner circle Ic corresponds to the edge of the screen 63. An image in a region inside the inner circle Ic in FIG. 14 corresponds to the first region Re1 projected on the screen 63. A region sandwiched between an outer circle Oc and the inner circle Ic in FIG. 14 corresponds to the video at the time when the leakage light arrives at the inner wall 57 of the gantry housing 51, that is, the second region Re2.

The boundary (the inner circle Ic) between the first region Re1 and the second region Re2, for example, is set in advance by the image processing circuitry 33 in the imaging control unit 17 (or the projector control apparatus 200). The patient P visually recognizes the first image in the first region Re1 via the screen 63 and the reflecting plate 67 and visually recognizes the second image in the second region Re2 projected on the inner wall 57 of the gantry housing 51. That is, the patient P placed on one's back on the couch top 131 visually recognizes the first image and the second image.

The region outside the outer circle Oc in FIG. 14 corresponds to an image projected on the inner wall 57 on the projector 100 side through the screen 63 which is formed when the projection light not passing through the gap G1 between the edge of the screen 63 and the inner wall 57 of the gantry housing 51 arrives at the inner wall 57 of the gantry housing 51. As illustrated in FIGS. 12 to 14, the projected image formed by the projection light is arranged around the patient P.

According to the above-described configuration, it is possible to obtain effects to be described as follows.

According to the magnetic resonance imaging apparatus 10 of the present embodiment, it is possible to form the light generated by the projector 100 in a shape that can arrive at the inner wall 57 of the gantry housing 51 in relation to the bore 53 through the screen 63 inserted inside the bore 53. That is, a projected image projected from the projector 100 includes the first region Re1 projected on the screen 63 and the second region Re2 projected on the inner wall 57 of the gantry housing 51 in relation to the bore 53 according to the magnetic resonance imaging apparatus 10.

Accordingly, the patient P inserted inside the bore 53 of the magnetic resonance imaging apparatus 10 can visually recognize the image corresponding to the first region Re1 via the reflecting plate 67 in the central region of the own viewing angle range, and visually recognize the image corresponding to the second region Re2 projected on the inner wall 57 in the region outside the central region. That is, it is possible to set the range in which the image projected by the projector 100 is projected to approximate to the viewing angle range of the patient P as much as possible, and it is possible to fill substantially the entire viewing angle range of the patient P inserted inside the bore 53 of the magnetic resonance imaging apparatus 10 with the image projected from the projector 100. Accordingly, the patient P inserted inside the bore 53 can obtain a sense of being surrounded by the image or the projection light, that is, a sense of immersion with respect to the image according to the magnetic resonance imaging apparatus 10 of the present embodiment.

As above, according to the magnetic resonance imaging apparatus 10, it is possible to provide the environment in which the anxiety of the patient P is improved without causing the uncomfortable feeling to the patient P and the patient P can relax even when the RF coil 45 or the support arm 65 is arranged near the patient P during the MR examination with respect to the patient P. For example, it is possible to make the patient P concentrate on the projection (for example, the image projected on the screen 63), which is configured to relax the feeling, during the imaging with respect to the patient P, and further, it is possible to expect that the patient P hardly recognizes being present in a small space inside the bore 53.

Accordingly, it is possible to mitigate the sense of oppression inside the bore 53 and the stress against entering the bore 53 of the patient P (particularly, the patient with claustrophobia) during the MR imaging, and to improve the dwelling ability inside the bore. Further, when the movable screen apparatus 15 is arranged on the opposite side (the projector 100 side) to the couch 13, the leakage light passing through the gap G1 between the edge of the screen 63 and the inner wall 57 of the gantry housing 51, and the image projected on the screen 63 are projected on the inner wall 57 as impression when the patient P before being subjected to examination views the gantry housing 51, and thus, it is possible to give the sense of security toward the bore 53 to the patient P instead of impression as an inorganic tunnel.

First Modification Example

A difference between the present modification example and the embodiment is that image content (content) is different between an image (hereinafter, referred to as a first image) in a first region Re1 and an image (hereinafter, referred to as a second image) in a second region Re2. The difference in image content between the first image and the second image includes at least one difference among, for example, a hue, brightness and a pattern (texture or the like).

An image processing circuitry 33 (or a projector control apparatus 200) outputs data relating to a composite image obtained by synthesizing the first image and the second image to a projector 100 as data of a projected image which is projected by the projector 100. Incidentally, an imaging control unit 17 (or the projector control apparatus 200) may individually output data relating to the first image and data relating to the second image to the projector 100. At this time, the projector 100 emits projection light corresponding to the first image and projection light corresponding to the second image at the same time.

In either case, the projected image projected by the projector 100 includes the first image and the second image. For example, the second image is an image that corresponds to an arbitrary visual effect which is represented using a hue, brightness, and a pattern. To be specific, the second image is an image relating to an optimal visual effect that evokes a psychological effect (such as the sense of security, relaxation, concentration on the first image, and enhanced mode) with respect to the patient P before the examination or during the examination. In addition, the second image may be a hue, brightness, or a pattern which corresponds to a pulse sequence or the like being executed with respect to the patient P.

In addition, the image processing circuitry 33 (or the projector control apparatus 200) may create data relating to the projected image to be projected by the projector 100 such that at least one among the hue, brightness, and the pattern is different between the first image relating to the first region Re1 and the second image relating to the second region Re2 according to an operator's instruction input through an input circuitry 36. In addition, the image processing circuitry 33 (or the projector control apparatus 200) may perform trimming on data corresponding to a region outside the second region Re2 in the projected image projected by the projector 100.

FIGS. 15 and 16 are diagrams illustrating examples in which the image content is different between the first image and the second image. In FIGS. 15 and 16, the first image in the first region Re1 is the same image as the first region Re1 in FIG. 14. In FIGS. 15 and 16, the second image in the second region Re2 is different from the image in the first region Re1, and is the image that provides a further relaxation effect with respect to the image in the first region Re1 and enables the patient P to concentrate on the image in the first region Re1. Incidentally, the projection light relating to the second image is projected on an inner wall 57 of a gantry housing 51, and thus, may include an image obtained by reducing a strain of the projected image caused depending on an angle between a projection direction and the inner wall 57, and an image pattern and color arrangement, which is associated with the first image. In addition, the projection light relating to the second image may include an image pattern and color arrangement as an environmental image that relaxes the subject P inserted inside the bore in accordance with a shape of the inner wall 57 of a bore 53.

The second region Re2 in FIGS. 15 and 16 includes three different hues, for example. In FIGS. 15 and 16, a region Re2SB is light blue, a region Re2Y is yellow, and a region Re2O is orange.

Figure 17:
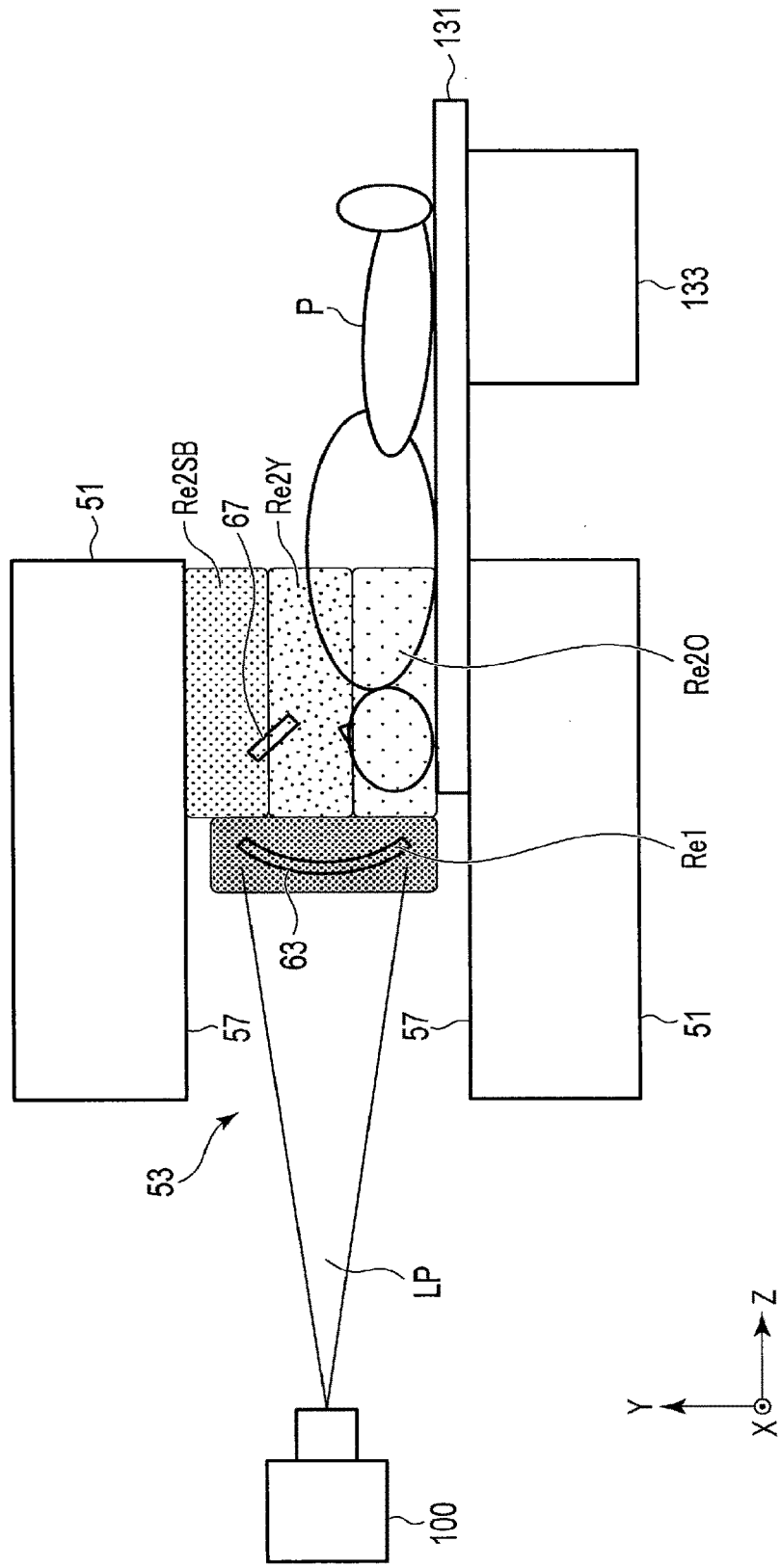
FIG. 17 is a diagram illustrating an example of correspondence relation between the second image projected on an inner wall of a gantry housing and a hue in a case in which a second region includes three hues according to the first modification example of the present embodiment.

FIG. 17 is a diagram illustrating an example of correspondence relation between the second image projected on an inner wall 57 of a gantry housing 51 and a hue in a case in which the second region Re2 includes the above-described three hues. As illustrated in FIG. 17, the projection light corresponding to the region Re2SB in the second image is projected onto the vicinity of an upper side of the inner wall 57. As illustrated in FIG. 17, the projection light corresponding to the region Re2Y in the second image is projected onto the vicinity of a center of the inner wall 57. As illustrated in FIG. 17, the projection light corresponding to the region Re2O in the second image is projected onto the vicinity of a lower part of the inner wall 57.

Figure 18:
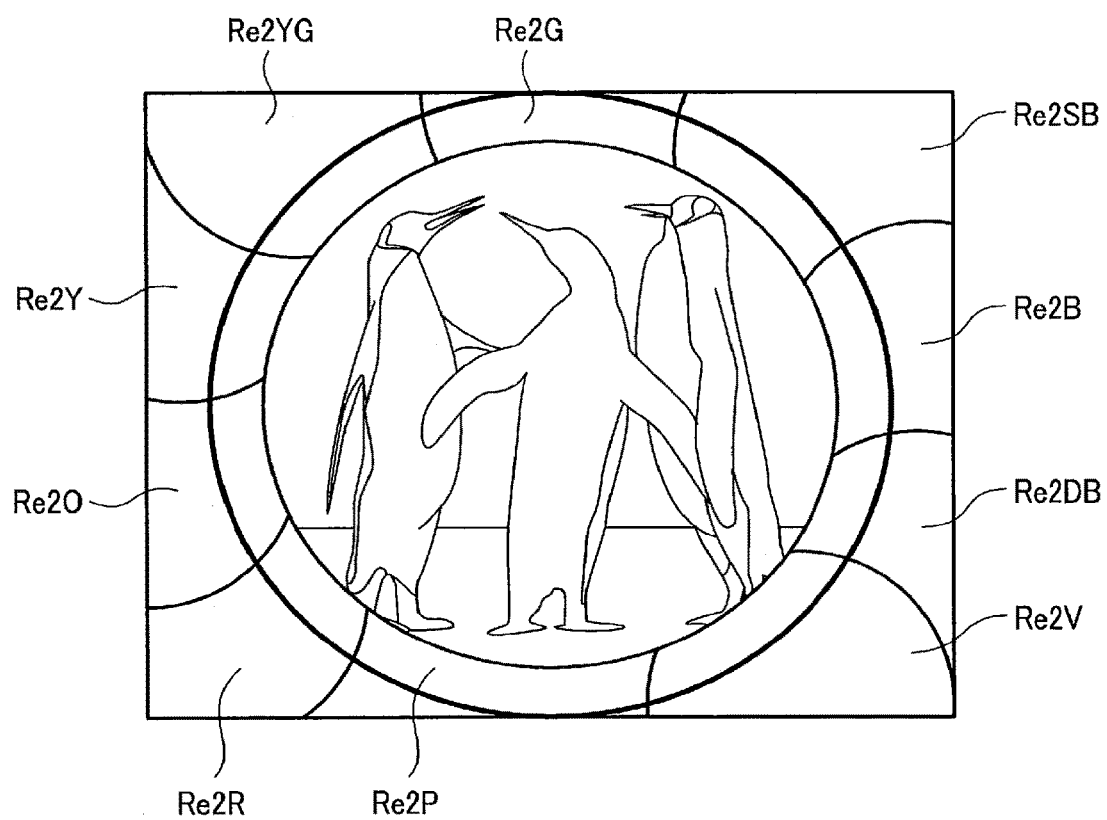
FIG. 18 is a diagram illustrating another example of the second image in the second region together with the first image in a first region according to the first modification example of the present embodiment.

FIG. 18 is a diagram illustrating another example of the second image in the second region Re2 together with the first image in the first region Re1 according to the present modification example. As illustrated in FIG. 18, the second image in the second region Re2 has, for example, 10 kinds of hues and a shape (spiral shape) that facilitates the patient P to concentrate on the first image. In the second region Re2 in FIG. 18, the hue of the region Re2SB is light blue, a hue of a region Re2B is blue, a hue of a region Re2DB is navy, a hue of a region Re2V is purple, a hue of a region Re2P is burgundy, a hue of a region Re2R is red, the hue of the region Re2O is orange, the hue of the region Re2Y is yellow, a hue of a region Re2YG is yellow green, and a hue of a region Re2G is green, respectively, in the plurality of regions partitioned into spiral shapes.

Figure 19:
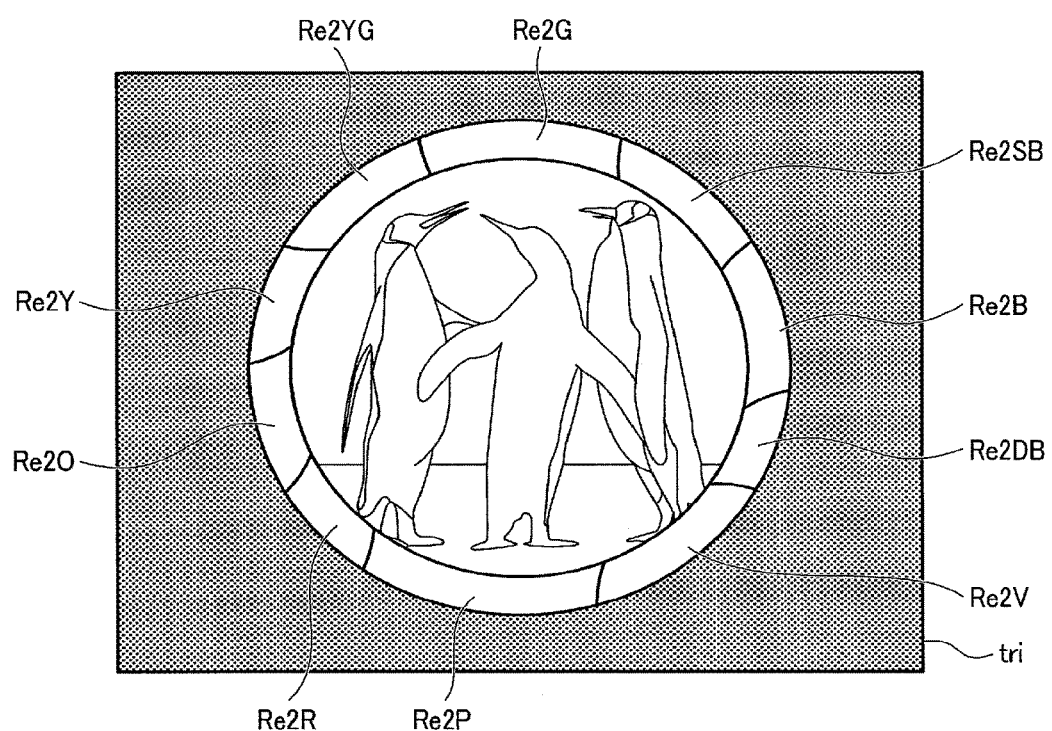
FIG. 19 is a diagram illustrating an example of a projected image in which a region outside the second region is trimmed according to the first modification example of the present embodiment.

FIGS. 15 and 19 are diagrams illustrating examples of the projected image in which a region tri outside the second region Re2 is trimmed. FIG. 15 is an image in which the region tri outside the second region Re2 in FIG. 16 is trimmed in advance and projected on the screen 63 and the inner wall 57. That is, the region tri outside the second region Re2 is trimmed in the data relating to the projected image corresponding to FIG. 16, and the projection light corresponding to the trimmed data is projected on the screen 63 and the inner wall 57 of the gantry housing 51 by the projector 100.

FIG. 19 is the diagram illustrating the example of the projected image in which the region tri outside the second region Re2 in FIG. 18 is trimmed. That is, the region tri outside the second region Re2 is trimmed in the data relating to the projected image corresponding to FIG. 19, and the projection light corresponding to the trimmed data is projected on the screen 63 and the inner wall 57 of the gantry housing 51 by the projector 100.

According to the magnetic resonance imaging apparatus 10 of the present modification example, it is possible to obtain effects to be described hereinafter in addition to the effects according to the present embodiment.

According to the magnetic resonance imaging apparatus 10 of the present modification example, it is possible to provide the visual environment in which the first image reflected on the reflecting plate 67 and the second image reflected on the inner wall 57 of the gantry housing 51 are combined to the patient P. In addition, it is possible to apply an image corresponding to the optimal visual effect with respect to the patient P to the second image depending on a purpose according to the present modification example.

For example, the magnetic resonance imaging apparatus 10 according to the present modification example can change a hue (color that makes the patient P comfortable), brightness (brightness that makes the patient P comfortable), and a pattern (pattern shape that makes the patient P comfortable) of the second image in accordance with the relaxation effect (psychological action) and perform the trimming of the outer portion of the second region Re2 in the projected image, the reduction of the strain in the projected image caused depending on the angle between the projection direction and the inner wall 57, or the like. In addition, it is possible to project the image, which relates to the optimal visual effect with respect to the patient P, on the inner wall 57 of the gantry housing 51 as the second image before the examination or during the examination according to the present modification example. In addition, it is possible to project the projection light relating to the second image on the inner wall 57 of the bore 53 in accordance with the shape of the inner wall 57 of the bore 53 according to the present modification example. Accordingly, it is possible to more aggressively include the surroundings of the subject P, inserted inside the bore, in the image according to the present modification example. Thus, it is possible to provide the image environment in which the subject P may feel a sense of unity with the image to the subject P and to further improve the dwelling ability inside the bore of the gantry 11 according to the present modification example.

In this manner, it is possible to provide the enhanced relaxation effect in relation to the first image to the patient P, to provide the visual environment that prevents the patient P from feeling the bore 53, and to provide the optimal visual effect with respect to the patient P before the examination or during the examination according to the magnetic resonance imaging apparatus 10 of the present modification example.

Second Modification Example

A difference between the present modification example and the embodiment is that the second image corresponds to an image in which a projected image is trimmed in accordance with a screen 63.

An image processing circuitry 33 (or a projector control apparatus 200) outputs image data (hereinafter, referred to as trimming image data) obtained after execution of a trimming process, which will be described hereinafter, to a projector 100. Accordingly, projection light corresponding to the trimming image data is projected on an inner wall 57 of a gantry housing 51 and is projected as an image of a trimmed outer portion. For example, the image processing circuitry 33 (or the projector control apparatus 200) executes trimming (hereinafter, referred to as the trimming process) with respect to a predetermined projected image in accordance with the screen 63.

The trimming process is executed in accordance with the screen 63. A shape of trimming in accordance with the screen 63 is not limited to a shape of the screen. For example, a trimming shape is set to a circle, when a shape of the screen 63 is an ellipse and the trimming into an elliptical shape gives an uncomfortable feeling to a patient P.

Incidentally, the trimming process is not limited to be executed in accordance with the shape of the screen 63. The trimming process may be executed in accordance with an outer shape of each silhouette of various characters (mascots, animation or the like). In addition, trimming that evokes a visual stimulus with respect to the patient P during imaging may be executed in the trimming process.

Examples of the visual stimulus include trimming that evokes (calculation (mental arithmetic or calculating formula) with respect to the patient P, trimming of a region of a first image corresponding to a front face of a central visual field of a right eye of the patient P and a region of a first image corresponding to a central visual field of a left eye of the patient P into different shapes, trimming for causing the patient P to concentrate on the first image, and brightness contrast, texture, motion, binocular parallax or the like of the projected image.

In addition, there is a possibility that a light source of the projector 100 is included in a viewing angle range of an attendant or the like who is positioned near the couch 13 due to leakage light. Thus, the trimming process may be performed such that data corresponding to a second region Re2 of the projected image projected by the projector 100 is trimmed in order to prevent the light source from being included in the viewing angle range of the attendant or the like.

Figure 20:
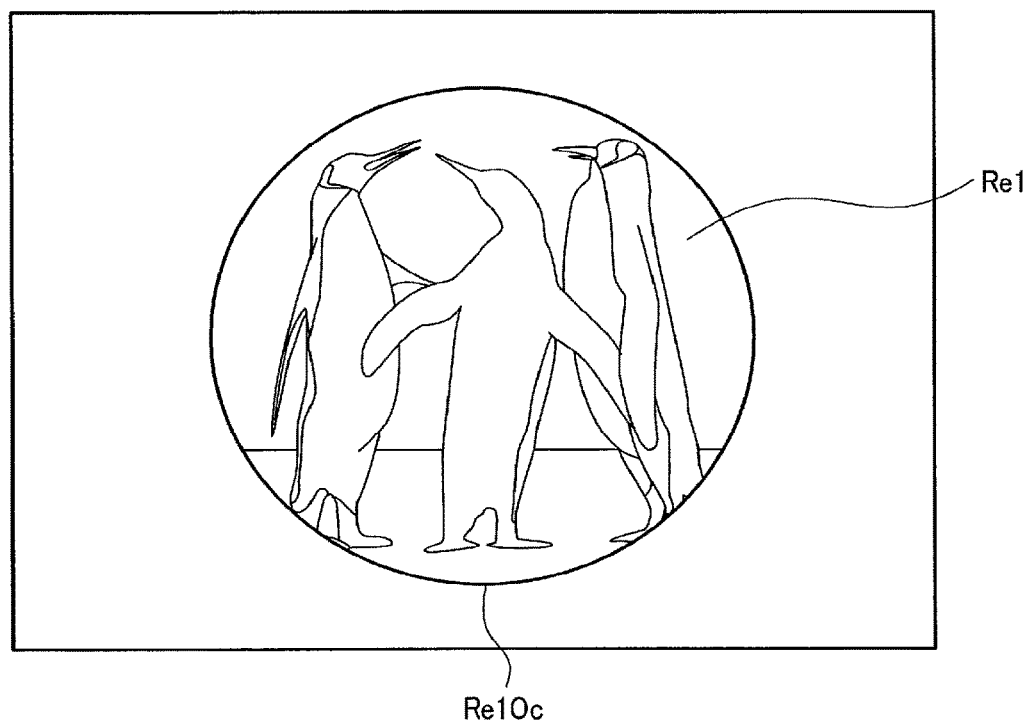
FIG. 20 is a diagram illustrating an example of trimming of an image in accordance with a screen according to a second modification example of the present embodiment.

FIG. 20 is a diagram illustrating an example of trimming of an image in accordance with the screen 63. As illustrated in FIG. 20, circular trimming is executed in a region outside an outer edge portion Re1Oc of a first region Re1 A hue corresponding to the second region Re2 in FIG. 20 has a single hue, for example as compared with FIG. 14.

Figure 21:
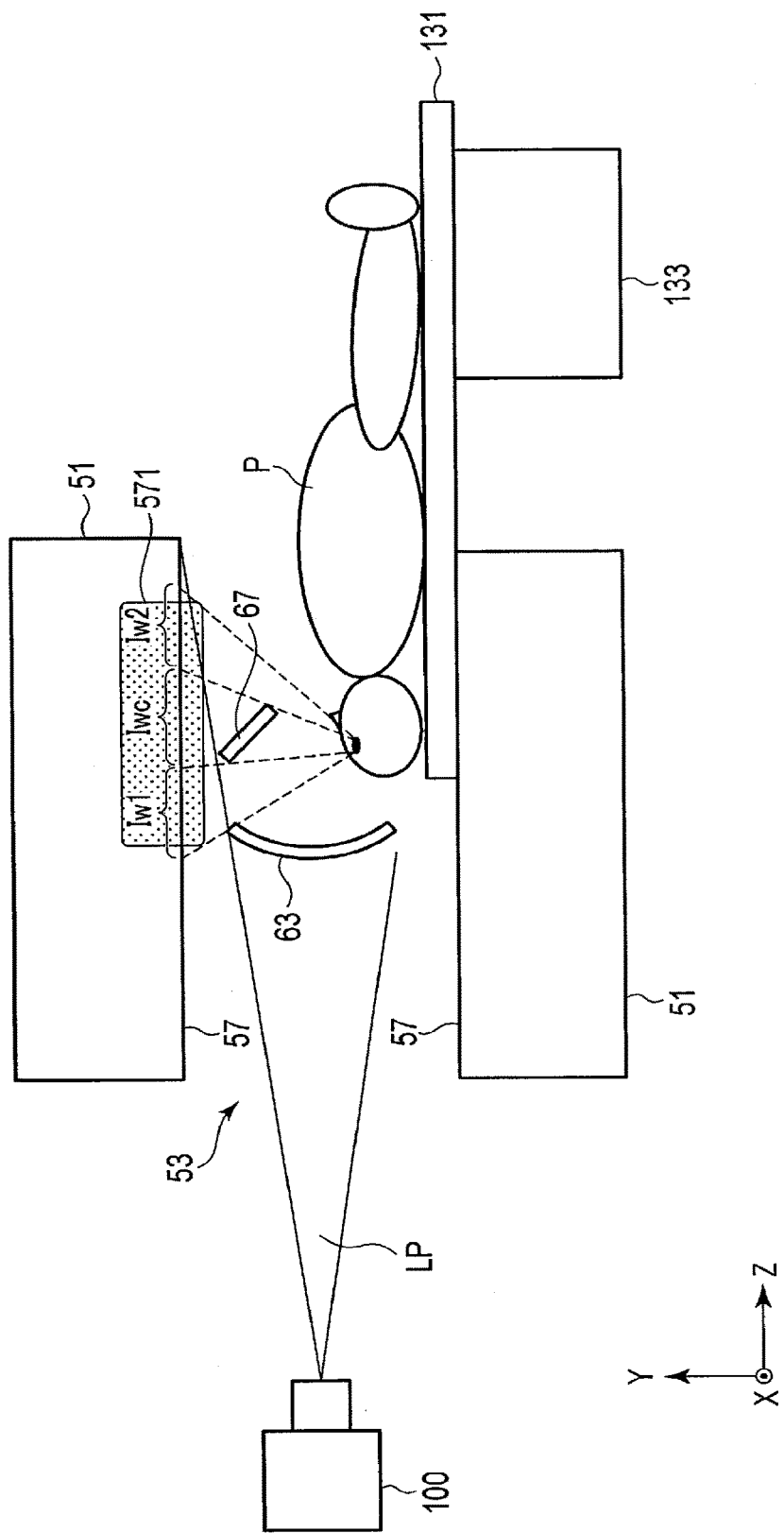
FIG. 21 is a diagram illustrating an example in which projection light corresponding to a trimmed second image is projected on an inner wall of a gantry housing according to the second modification example of the present embodiment.

FIG. 21 is a diagram illustrating an example in which the projection light corresponding to a trimmed second image is projected on the inner wall 57 of the gantry housing 51. As illustrated in FIG. 21, the projection light corresponding to the region outside the first image in FIG. 20 is projected on an inner wall (Iw1 and Iw2) 571 of the gantry housing 51 in FIG. 21.

According to the magnetic resonance imaging apparatus 10 of the present modification example, it is possible to obtain effects to be described hereinafter in addition to the effects according to the present embodiment.

According to the magnetic resonance imaging apparatus 10 of the present modification example, it is possible to project the second image onto the inner wall 57 of the gantry housing 51 using the trimming image data which is trimmed in accordance with the screen 63. It is possible to allow the patient P to clearly recognize the first image, which is visually recognized by the patient P through a reflecting plate 67 and the second image, which is projected on the inner wall 57 of the gantry housing 51, by executing the trimming of the data relating to the image in accordance with the screen 63. In addition, it is possible to intentionally make the first image and the second image ambiguous through the above-described trimming. Accordingly, it is possible to accentuate content, that is, a character in image content of the first image in the case of projecting a combination of the first image and the second image or the first image.

In addition, the image to be trimmed is not necessarily a shape of the screen 63, and it is also possible to change the same shape as the shape of the screen 63 or a line to be trimmed (hereinafter, referred to as a trimming line) in the magnetic resonance imaging apparatus 10 according to the present modification example. At this time, the adjustment (change) of the trimming line performed by the image processing circuitry 33 or the like can be utilized as various methods of creating the first image using the second image projected on the inner wall 57 of the gantry housing 51.

For example, the adjustment of the trimming line may be used in order for research on the visual stimulus with respect to the patient P or may be used for projection of a silhouette of a character in order for relaxation of the patient P. In addition, it is possible to limit a leakage light arrival range in which the second image is projected to a minimum range through the trimming process intentionally performed such that the light source is not included in the viewing angle range of the attendant, a caregiver or the like, and it is possible to mitigate a load give to vision of the attendant, the caregiver, and the like according to the magnetic resonance imaging apparatus 10 of the present modification example.

As above, it is possible to project the image trimmed for various purposes on both the screen 63 and the inner wall 57 of the gantry housing 51, and to provide the visual environment in accordance with the patient P, the attendant, and the purpose according to the magnetic resonance imaging apparatus 10 of the present modification example.

Third Modification Example

A difference between the present modification example and the embodiment is that vicinity of a boundary between a first region Re1 and a second region Re2 is brightened in a second image to make a patient P naturally recognize a first image.

An image processing circuitry 33 (or a projector control apparatus 200) outputs the second image obtained by changing at least one of brightness and a hue of the second image from the boundary between the first region Re1 and the second region Re2 or a trimming line toward an outer edge of the second region Re2 to a projector 100 together with the first image. Accordingly, projection light corresponding to the second image is projected on an inner wall 57 of a gantry housing 51 as the image of which at least one of the brightness and the hue is changed.

To be specific, the image processing circuitry 33 (or the projector control apparatus 200) creates data corresponding to the projected image by changing at least one of the brightness and the hue of the second image so as to enable the Savannah effect with respect to the first image, and outputs the data to the projector 100. The above-described change, performed to realize the Savannah effect with respect to the first image, includes a change of the brightness and a change of the hue in the second region Re2, for example. Incidentally, the change of the hue and the change of the brightness in the second image are not limited to the following descriptions as long as it is possible to realize the Savannah effect.

The image processing circuitry 33 (or the projector control apparatus 200) determines the brightness at the above-described boundary or the trimming line of the second image as the same level of brightness as brightness of the first image. The image processing circuitry 33 (or the projector control apparatus 200) decreases the brightness of the second image in a stepwise manner from the above-described boundary or the trimming line toward the outer edge of the second region Re2 in the second image (brightness gradation).

The image processing circuitry 33 (or the projector control apparatus 200) determines a hue of the above-described boundary or the trimming line of the second image as a hue which represents a hue of an outer edge of the first region Re1. The image processing circuitry 33 (or the projector control apparatus 200) changes the hue of the second image into black in a stepwise manner from the above-described boundary or the trimming line toward the outer edge of the second region Re2 in the second image (hue gradation).

Figure 22:
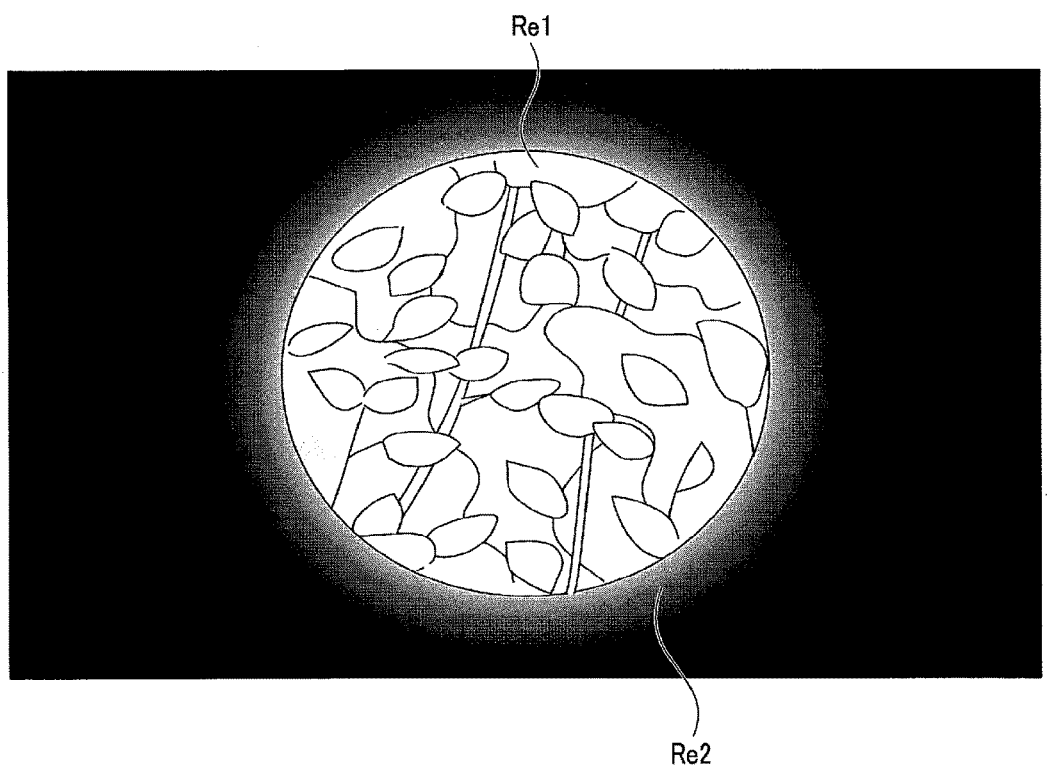
FIG. 22 is a diagram illustrating an example of an image (a second image which realizes the Savannah effect with respect to a first image), which is visually recognized by a patient placed on a couch top according to a third modification example of the present embodiment.

FIG. 22 is a diagram illustrating an example of an image (the second image which realizes the Savannah effect with respect to the first image), which is visually recognized by the patient P placed on a couch top 131. As illustrated in FIG. 22, the second image has each uniform gradation of the brightness and the hue from the outer edge portion of the first region Re1 toward the outer edge of the second region Re2.

To be specific, when the first image illustrated in FIG. 22 has green as a basic tone, the hue gradation in the second image (the second region Re2) corresponds to a stepwise change from green to black starting from the outer edge portion of the first region Re1 toward the outer edge portion of the second region Re2. In addition, the brightness gradation in the second region Re2 illustrated in FIG. 22 corresponds to a stepwise decrease from the same level of brightness as the brightness of the first image in the vicinity of the boundary starting from the outer edge portion of the first region Re1 toward the outer edge portion of the second region Re2.

To be specific, the image processing circuitry 33 (or the projector control apparatus 200) creates the data corresponding to the projected image by changing at least one of the brightness and the hue of the second image so as to allow the patient P to recognize that he is watching the first image in a wide space, and outputs the data to the projector 100. Incidentally, the invention is not limited to the following description as long as it is possible to allow the patient P to recognize that he is watching the first image in the wide space.

The image processing circuitry 33 (or the projector control apparatus 200) determines the hue in the second region Re2 based on the hue in the first region Re1. The hue in the second region Re2 is a hue obtained by, for example, averaging the hue of the outer edge of the first region Re1 or the hue of the first image in the first region Re1.

The image processing circuitry 33 (or the projector control apparatus 200) changes the hue of the second image from white into the determined hue in a stepwise manner from the above-described boundary or the trimming line toward the outer edge of the second region Re2 in the second image (hue gradation). At this time, a hue of a surrounding region, which surrounds the first image (the first region Re1) with a predetermined width, is set to white in the second region Re2.

The image processing circuitry 33 (or the projector control apparatus 200) determines the brightness at the surrounding region of the second image as the same level of brightness as brightness of an outer edge portion of the first image. That is, the brightness of the surrounding region in the second image is adapted to the brightness of the outer edge portion of the first image. The image processing circuitry 33 (or the projector control apparatus 200) decreases the brightness of the second image in a stepwise manner from the surrounding region toward the outer edge of the second region Re2 in the second image (brightness gradation).

Figure 23:
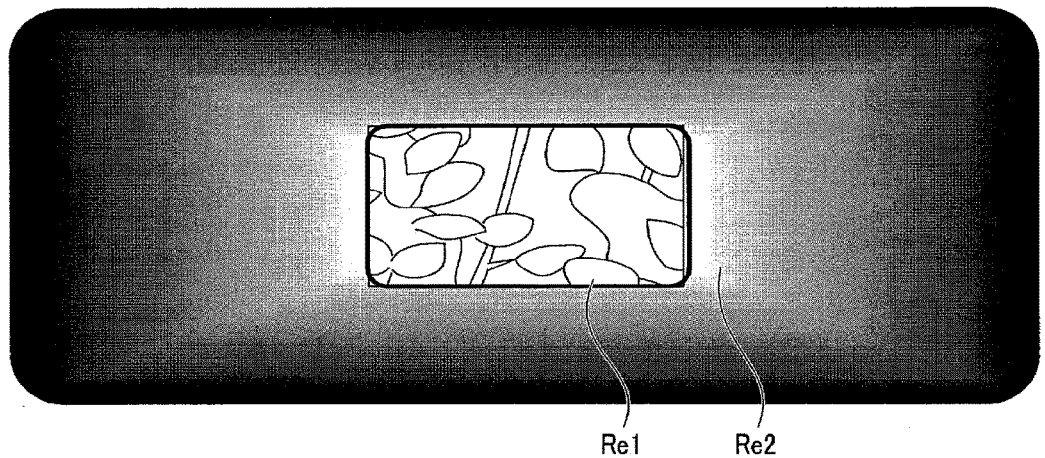
FIG. 23 is a diagram illustrating an example of an image (the second image which is configured to allow the patient to recognize that he is watching the first image in a wide space), which is visually recognized by the patient placed on the couch top according to the third modification example of the present embodiment.

FIG. 23 is a diagram illustrating an example of the image (the second image which is configured to allow the patient P to recognize that he is watching the first image in the wide space), which is visually recognized by the patient P placed on the couch top 131. As illustrated in FIG. 23, the second image has each uniform gradation of the brightness and the hue from the surrounding region toward the outer edge of the second region Re2.

To be specific, when the first image illustrated in FIG. 23 has green as a basic tone, the hue gradation in the second image (the second region Re2) corresponds to a stepwise change from white to green starting from the surrounding region toward the outer edge portion of the second region Re2. In addition, the brightness gradation in the second region Re2 illustrated in FIG. 23 corresponds to a stepwise decrease from the same level of brightness as the brightness of the first image starting from the surrounding region toward the outer edge portion of the second region Re2.

According to the magnetic resonance imaging apparatus 10 of the present modification example, it is possible to obtain effects to be described hereinafter in addition to the effects according to the present embodiment.

According to the magnetic resonance imaging apparatus 10 of the present modification example, there is a possibility that an image of a screen 63 is reflected by the reflecting plate 67 includes not only the first image but there is a possibility that an image (the second image projected on the inner wall 57 of the gantry housing 51) on an outer side than an outer diameter RS of the screen is also reflected, and thus, it is possible to brighten the brightness of a trimming position (near the boundary) and to decrease the brightness toward the outside of the second region Re2 (darken the second image).

Accordingly, the magnetic resonance imaging apparatus 10 according to the present modification example can provide the visual environment (the Savannah effect) to allow the patient P to concentrate more on the first image or to feel comfortable, and further, to give a sense of openness to the patient P. Further, it is possible to suitably change each gradation of the hue and the brightness in accordance with content of the first image and the visual effect, and to optimize the effects according to the present modification example.

In addition, it is possible to project the second image on the inner wall 57 by setting brightness of the periphery (including the inner wall 57) of the reflecting plate 67 to the same level of brightness as the brightness of the image on the reflecting plate 67 according to the magnetic resonance imaging apparatus 10 of the present modification example. Accordingly, it is possible to reduce an excessive difference in brightness in the vicinity of a central visual field of the patient P. That is, when the inner wall 57 near the patient P is dark as compared to the image (mainly the first image) on the reflecting plate 67, it is possible to mitigate an impression of the patient P feeling that the brightness of the image on the reflecting plate 67 is stronger than brightness of the periphery, and to reduce fatigue of eyes of the patient P during an examination.

In this manner, it is possible to provide the environment in which the patient P can concentrate on and visually recognize the first image the state of mitigating a sense of stagnation with respect to the bore 53, and to provide the feeling of watching the image in a wide space to the patient P according to the magnetic resonance imaging apparatus 10 of the present modification example.

Further, a predetermined irradiator (for example, a light-emitting diode (LED)) may be provided on a back face side (upper face side of the inner wall 57 of the gantry housing 51) of the reflecting plate 67 as a configuration to further improve the effects according to the present modification example. At this time, it is possible to improve the brightness around the reflecting plate 67 using the irradiator.

Fourth Modification Example

A difference between the present modification example and the embodiment is that a second image projected on an inner wall 57 of a gantry housing 51 is an image which is obtained by changing at least one among a hue, brightness, and a pattern depending on a position of the inner wall 57 along a circumferential direction.

An image processing circuitry 33 (or a projector control apparatus 200) outputs data (hereinafter, referred to as circumferential-direction gradient data) relating to the second image, obtained by changing at least one among the hue, the brightness, and the pattern depending on the position of the inner wall 57 along the circumferential direction to a projector 100 together with data relating to a first image. Accordingly, projection light corresponding to the second image is projected on the inner wall 57 of the gantry housing 51 as the image of which at least one of the hue, the brightness, and the pattern is changed depending on the position of the inner wall 57 along the circumferential direction.

To be specific, the image processing circuitry 33 (or the projector control apparatus 200) creates the circumferential-direction gradient data based on the position of the inner wall 57 along the circumferential direction. Projection light (hereinafter, referred to as upper projection light), which arrives at an upper part of the inner wall, for example, in the projection light emitted from the projector 100 based on the circumferential-direction gradient data, includes at least one among the brightness, the hue, and the pattern forming a bright image at the time of projection, projection light (hereinafter, referred to as lower projection light), which arrives at a lower part of the inner wall, includes at least one among the brightness, the hue, and the pattern forming a dark image at the time of projection, and projection light which arrives at a side portion of the inner wall between the upper part of the inner wall and the lower part of the inner wall includes at least one among the brightness, the hue, and the pattern such that the brightness of the image decreases from the upper projection light to the lower projection light at the time of projection.

Figure 24:
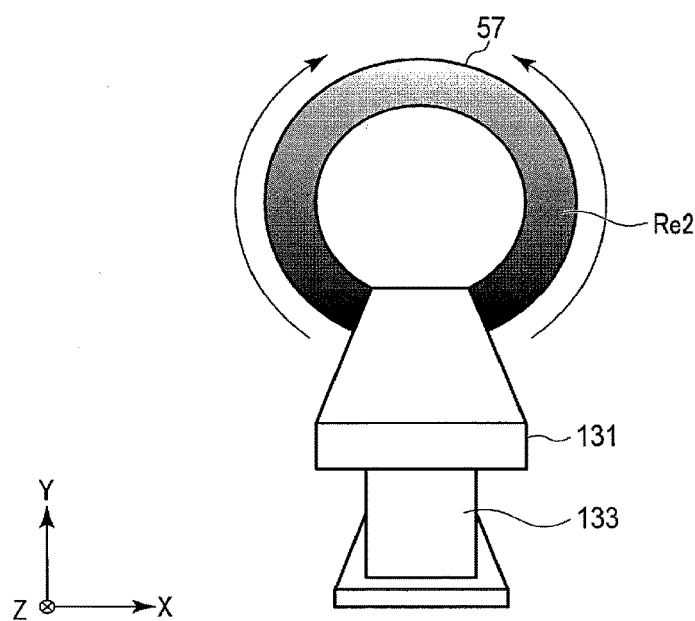
FIG. 24 is a diagram illustrating that an inner wall becomes brighter from a lower part of the inner wall toward an upper part of the inner wall in a stepwise manner in a circumferential direction of the inner wall by projection light arriving at the inner wall according to a fourth modification example of the present embodiment in a perspective manner.

FIG. 24 is a diagram illustrating that the inner wall 57 becomes brighter from the lower part of the inner wall toward the upper part of the inner wall in a stepwise manner in the circumferential direction by the projection light arriving at the inner wall 57 in a perspective manner. As illustrated in FIG. 24, the second image to be projected on the inner wall 57 of the gantry housing 51 by leakage light has brightness gradation depending on the position of the inner wall 57 along the circumferential direction.

As illustrated in FIG. 24, a relatively bright image is projected on the upper part of the inner wall as the second image. A relatively dark image is projected on the lower part of the inner wall as the second image. In addition, an image of which brightness decreases from the upper part of the inner wall to the lower part of the inner wall is projected on the side portion of the inner wall as the second image.

Figure 25:
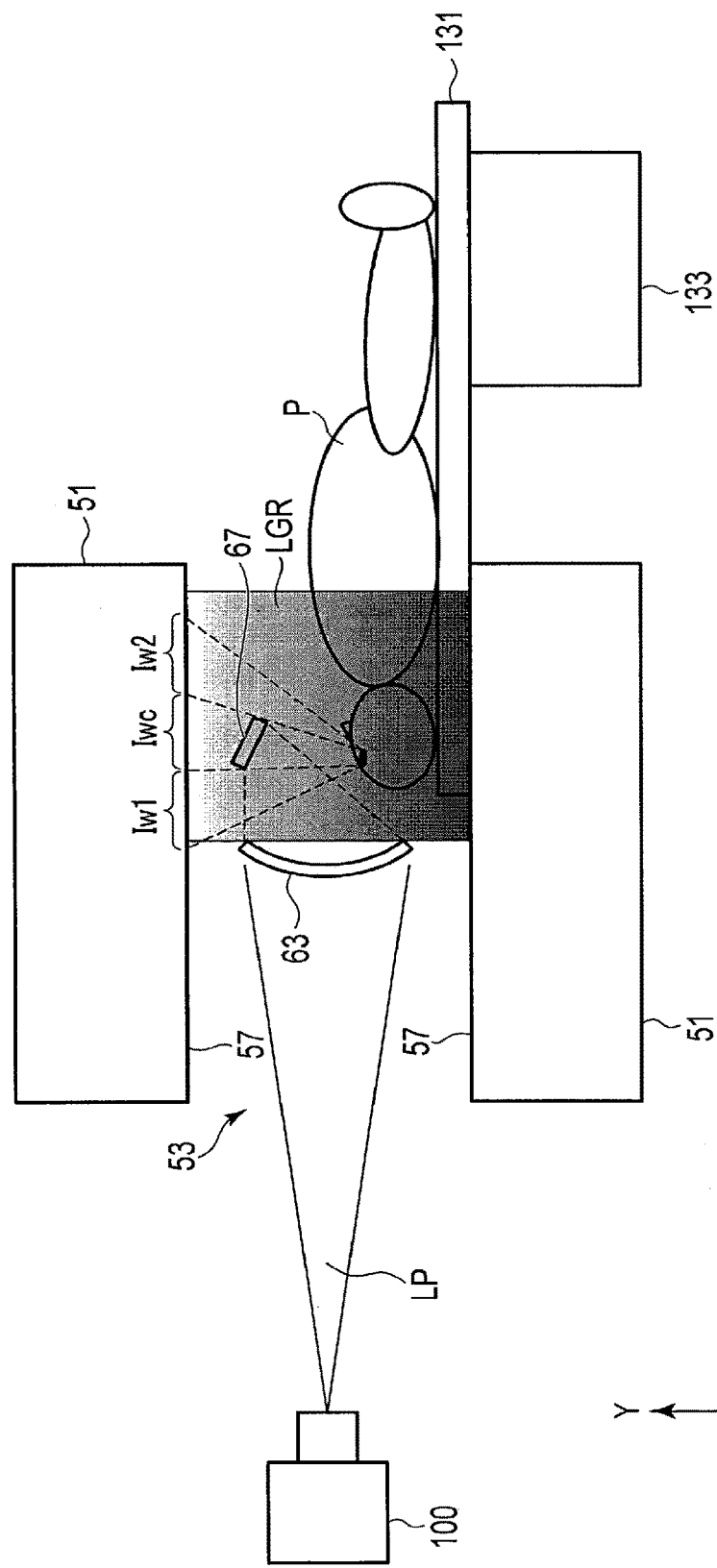
FIG. 25 is a diagram illustrating an example of brightness gradation according to the projection light projected according to circumferential-direction gradient data in a cross section of a magnetic resonance imaging system according to the fourth modification example of the present embodiment viewed from a side face.

FIG. 25 is a diagram illustrating an example of brightness gradation according to the projection light projected according to the circumferential-direction gradient data in a cross section of a magnetic resonance imaging system 1 from a side face. As illustrated in FIG. 25, the bright image is projected on the upper part of the inner wall, the dark image is projected on the lower part of the inner wall, and the image reflecting the brightness gradation is projected on the side portion of the inner wall. As illustrated in FIG. 25, viewing angle ranges (Iw1 and Iw2) on the upper part of the inner wall become brighter than other positions of the inner wall 57 by the upper projection light. In FIG. 25, LGR represents an example of the brightness gradation projected on the inner wall 57 of the gantry housing 51.

As illustrated in FIGS. 24 and 25, each vicinity of a side face and a lower face of the patient P placed on a couch top 131 is darker than the vicinity of an upper face of the patient P. In other words, the vicinity of the upper face of the patient P placed on the couch top 131 is brighter than each vicinity of the side face and the lower face of the patient P.

According to the magnetic resonance imaging apparatus 10 of the present modification example, it is possible to obtain effects to be described hereinafter in addition to the effects according to the present embodiment.

According to the magnetic resonance imaging apparatus 10 of the present modification example, it is possible to brighten the surroundings of the patient P placed on the couch top 131 from the lower part of the inner wall to the upper part of the inner wall in a stepwise manner. Accordingly, it is possible to provide the light environment with the brightness gradation from the lower part of the inner wall to upper part of the inner wall in the viewing angle range of the patient P placed on the couch top 131.

For example, it is possible to provide the light environment in which the periphery of the patient P is in a relatively dark state and the central visual field of the patient P (the upper part of the inner wall) is in a bright state, and to realize the environment for more effective relaxation with respect to the patient P according to the magnetic resonance imaging apparatus 10 of the present modification example.

In addition, an impression of the patient P toward the image projected on the inner wall 57 of the gantry housing 51 is different depending on a direction of the patient P placed on the couch top 131 (setting environment of the patient P), but the sensitivity of vision deteriorates in a visual field (peripheral visual field) from the upper part of the inner wall 57 of the gantry housing 51 to the lower part of the inner wall 57 along the circumferential direction since a reflecting plate 67 is present substantially at the center (near a central visual field) of the viewing angle range of the patient P in relation to the patient P having a supine posture who receives frequent examinations. Thus, it is possible to provide the environment that enables relaxation of the patient P by changing at least one among the hue, the brightness, and the pattern along the circumferential direction of the inner wall 57 according to the magnetic resonance imaging apparatus 10 of the present modification example.

Fifth Modification Example

A difference between the present modification example and the embodiment is that irradiation light relating to a hue corresponding to a second image is emitted in an irradiation range including an inner wall 57 to which the second image is projected using an irradiator provided in a space between a side face of a couch top 131 and the inner wall 57, provided in the inner wall which is lower than an upper face of a patient fixing tool (headrest) 137, or provided in a movable carriage 61.

A plurality of the irradiators are provided at the space between the side face of the couch top 131 and the inner wall 57 along a central axis (Z-axis) of a bore 53. To be specific, the plurality of irradiators are provided at a predetermined interval at positions between the side face of the couch top 131 and the inner wall 57 on a rail 55 in FIG. 4 (for example, positions 551 at the same level as a level of the couch top 131) along the Z-axis. Incidentally, the irradiator may be arranged at a position lower than the level of the couch top 131 in the above-described space.

Incidentally, the plurality of irradiators may be provided, for example, on the inner wall 57 lower than an upper face 1371 of the patient fixing tool 137 in FIG. 8 to be arrayed along the central axis of the bore 53. At this time, a position of the irradiator corresponds to a position with a predetermined height from the couch top 131, for example. Examples of the predetermined height include a distance from the couch top 131 to the shoulder of the patient P, a body thickness of the patient P, and the like.

The irradiator irradiates the inner wall 57 of the gantry housing 51 with the irradiation light under control of a system control circuitry 38. The irradiator indicates, for example, a plurality of LED's (light-emitting diodes of three colors), which can create light relating to the above-described hue, and the single irradiator includes the plurality of LED's respectively corresponding to the three primary colors of light. Incidentally, the irradiator is not limited to the LED. In addition, the irradiator may have the directivity of the irradiation light such that the irradiation light does not arrive at a reflecting plate 67 and a screen 63.

The system control circuitry 38 collects a position of the couch top 131 inside the bore 53. The system control circuitry 38 determines a position of the screen 63 inside the bore 53 based on the collected position collected of the couch top 131. The system control circuitry 38 determines the irradiation range of the irradiator toward the inner wall 57 of the gantry housing 51 depending on the position of the screen 63. The system control circuitry 38 controls the irradiator such that light of a hue corresponding to a second image is emitted to the determined irradiation range.

The irradiation range is a range, for example, from the position of the screen 63 to a position near the chest (or abdomen) of the patient P. The position near the chest of the patient P is stored in advance in a main memory circuitry 37 or the like, for example, as a predetermined distance along the Z-axis from the position of the screen 63 or an end of the couch top 131.

In addition, the system control circuitry 38 controls the irradiator such that the hue is realized in accordance with image content of the second image. For example, when the second image is an image of a leaf, a tree, woods, forest, or the like, the hue according to the image content is a hue representing image content such as green and yellow green or an average hue of the second image. In addition, when the second image is an image of sea, river, sky, or the like, the hue according to the image content is a hue representing image content such as blue, light blue, and indigo blue or an average hue of the second image.

Incidentally, the system control circuitry 38 may control the irradiator such that the hue is realized in accordance with a visual stimulus or the like in response to direction for further accentuation of image content of a first image or a purpose of research depending on the image content of the first image.

In addition, the system control circuitry 38 may control the irradiator so as to adjust the amount of light and the hue of the irradiation light in response to a desire of the patient P through an operator's instruction input through an input circuitry 36. At this time, the system control circuitry 38 controls the irradiator without changing each image content of the first image and the second image.

Further, when the couch top 131 on which the patient P is placed moves between an end of the bore 53 on the couch 13 side and an imaging position, the system control circuitry 38 controls the irradiator so as to change the hue of the irradiation light with which the inner wall 57 of the gantry housing 51 is irradiated. Incidentally, the system control circuitry 38 may control the irradiator such that a mode of changing the hue is changed depending on a movement direction of the couch top 131 along the Z-axis. At this time, each mode of changing the hue using the irradiation light with which the inner wall 57 of the gantry housing 51 is irradiated is different between a case in which the couch top 131 on which the patient P is placed moved from the outside of the bore 53 to the inside of the bore 53 and a case in which the couch top 131 on which the patient P is placed moved from the inside of the bore 53 to the outside of the bore 53.

FIG. 26 is a diagram illustrating an example of a plurality of irradiators 59 provided on the rail 55 and an irradiation range IRR. As illustrated in FIG. 26, the control of turning the plurality of irradiators 59 ON or OFF is executed depending on the position of the screen 63 inside the bore 53. As illustrated in FIG. 26, the irradiation light from the irradiator 59 is projected on the inner wall 57 in a viewing angle range of the patient P.

FIG. 27 is a front view according to the bore 53 of the gantry 11. As illustrated in FIG. 27, the irradiator 59 is provided at the position 551 between the side face of the couch top 131 and the inner wall 57 on the rail 55 or provided at a position 531 of the inner wall 57 which is lower than the upper face 1371 of the patient fixing tool 137 in FIG. 8.

In addition, the irradiator 59 may be provided in a region 613 or 615 of the movable carriage 61 in FIG. 10. When the irradiator 59 is provided in the region 613 of the movable carriage 61, the irradiator 59 irradiates a range from, for example, a placing face of the couch top 131 to the vicinity of the shoulder of the patient P placed on the couch top 131. In addition, the irradiator 59 has the directivity so as to prevent light emitted therefrom from arriving at the reflecting plate 67 and the screen 63. In addition, when the irradiator 59 does not have the above-described directivity, the movable carriage 61 has a shielding plate (not illustrated) that shields the irradiation of the irradiator 59 with respect to the reflecting plate 67 and the screen 63. At this time, the movable carriage 61 is equipped with a cable (not illustrated) which electrically connects the irradiator 59 and the system control circuitry 38 and is configured using a material that is not affected by a magnetic field. At this time, it is unnecessary to control the irradiation range using the system control circuitry 38, and the description regarding other control with respect to the irradiator 59 is the same as the above-described description, and thus, will be omitted.

According to the magnetic resonance imaging apparatus 10 of the present modification example, it is possible to obtain effects to be described hereinafter in addition to the effects according to the present embodiment.

According to the magnetic resonance imaging apparatus 10 of the present modification example, the irradiator 59 is provided in the space between the side face of the couch top 131 and the inner wall 57, the position 531 of the inner wall 57 lower than the upper face 1371 of the patient fixing tool 137, or the movable carriage 61, and thus, it is possible to irradiate the irradiation range IRR including the inner wall to which the second image is projected with the irradiation light having the hue corresponding to the second image or the like, which is different from a typical illumination (illumination which has neutral white or a single color and Illuminates a dark inside of the bore 53) to be arranged inside the bore 53 (the inner wall 57 of the gantry housing 51).

Accordingly, when the amount of light of the second image projected on the inner wall 57 using leakage light according to the present embodiment and the other modification examples is weak (insufficient), that is, when it is desirable to emphasize the hue of the second image since there is a limit in the amount of light of the second image using the leakage light which is watery light, or when the periphery of the patient P is brightened in response to a desire of the patient P, it is possible to emphasize the brightness of the second image and to brighten the periphery of the patient P without changing the image content of the projected image according to the magnetic resonance imaging apparatus 10 of the present modification example.

Further, when the couch top 131 on which the patient P is placed moves between an end of the bore 53 on the couch 13 side and an imaging position, it is possible to change the hue of the irradiation light with which the inner wall 57 is irradiated according to the magnetic resonance imaging apparatus 10 of the present modification example.

As above, the patient P inserted inside the bore 53 can acquire the feeling of being surrounded by the projection light and the irradiation light through synergy obtained by combination of the irradiation light and the leakage light according to the magnetic resonance imaging apparatus 10 of the present modification example. Further, it is possible to direct the periphery of the patient P who is watching the image to enable relaxation by changing the light when the couch top 131 moves to the imaging position.

Sixth Modification Example

A difference between the present modification example and the embodiment is that a surface of an inner wall 57 of a gantry housing 51 has a diffuse reflection function of diffusing and reflecting projection light.

Figure 28:
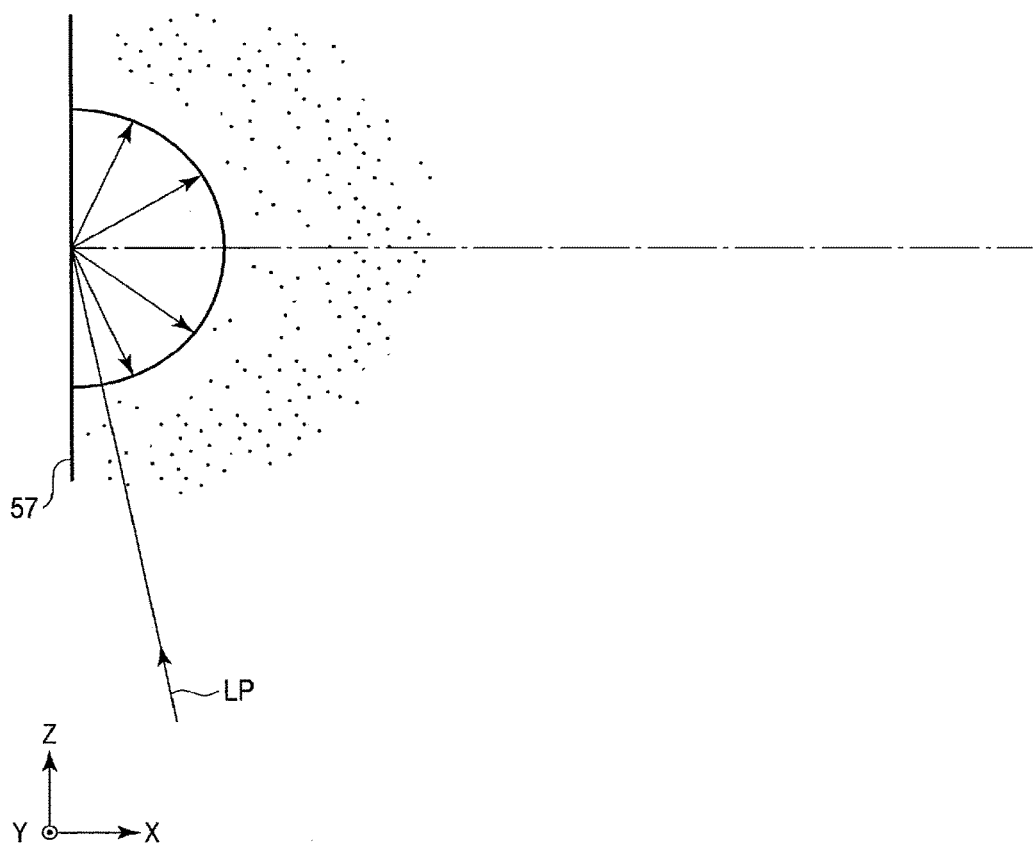
FIG. 28 is a diagram illustrating an example of a diffuse reflection function according to a sixth modification example of the present embodiment.

The surface of the inner wall 57 of the gantry housing 51 has the diffuse reflection function to diffuse and reflect the projection light projected by a projector 100. To be specific, the surface of the inner wall 57 is subjected to surface treatment such as coating (for example, coating to form finely uneven surface) and sand blasting used for a surface of a base material of a screen 63, for example. FIG. 28 is a diagram illustrating an example of the diffuse reflection function. As illustrated in FIG. 28, the surface treatment performed on the inner wall 57 of the gantry housing 51 contributes to improvement in projection efficiency of leakage light.

According to the magnetic resonance imaging apparatus 10 of the present modification example, it is possible to obtain effects to be described hereinafter in addition to the effects according to the present embodiment.

According to the magnetic resonance imaging apparatus 10 of the present modification example, the surface treatment for realization of the diffuse reflection function is executed on the surface of the inner wall 57 of the gantry housing 51. Accordingly, the inner wall 57 of the gantry housing 51 according to the magnetic resonance imaging apparatus 10 of the present modification example has the improved projection efficiency of a second image, can more clearly reflect the second image, can provide a more suitable dwelling environment to the patient P arranged inside the bore 53.

According to the magnetic resonance imaging apparatus of at least one embodiment described above, it is possible to improve the dwelling ability inside the bore of the gantry.

According to the medical image diagnostic apparatus of the above-described embodiment and application examples, it is possible to improve the dwelling ability inside the bore of the gantry.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A medical image diagnostic apparatus comprising:
a gantry for medical imaging which includes a bore; and
a screen which is insertable into the bore and on which a predetermined image is projected by a projector, wherein
the screen is configured to form a shape that enables light generated by the projector to arrive at an inner wall of the gantry,
a projected image projected by the projector includes a first region projected on the screen and a second region projected on the inner wall, and
the first region and the second region have different image content.

2. A medical image diagnostic apparatus comprising:
a gantry for medical imaging which includes a bore; and
a screen which is insertable into the bore and on which a predetermined image is projected by a projector, wherein
the screen is configured to form a shape that enables light generated by projector to arrive at an inner wall of the gantry,
a projected image projected by the projector includes a first region projected on the screen and a second region projected on the inner wall, and
at least one among a hue, brightness, and a pattern is different between an image in the first region and an image in the second region.

3. The medical image diagnostic apparatus according to claim 2, wherein an image in the second region is obtained by changing at least one among the hue, the brightness, and the pattern depending on a position of the inner wall along a circumferential direction.

4. A Theft medical image diagnostic apparatus comprising:
a gantry for medical imaging which includes a bore; and
a screen which is insertable into the bore and on which a predetermined image is projected by a projector, wherein
the screen is configured to form a shape that enables light generated by the projector to arrive at an inner wall of the gantry,
a projected image projected by the projector includes a first region projected on the screen and a second region projected on the inner wall, and
an image in the second region corresponds to an image obtained by trimming the projected image in accordance with the screen.

5. The medical image diagnostic apparatus according to claim 4, wherein an image in the second region is an image obtained by changing at least one of brightness and a hue from a position corresponding to a boundary of the trimming in the projected image toward an outer edge of the second region.

6. The medical image diagnostic apparatus according to claim 4, wherein an image in the second region has a brightness that at a position corresponding to a boundary of the trimming in the projected image is equal to a brightness of an outer edge portion of the first region and the brightness of the second region decreases from the position corresponding to the boundary of the trimming toward an outer edge of the second region.

7. A medical image diagnostic apparatus comprising:
a gantry for medical imaging which includes a bore;
a screen which is insertable into the bore and on which a predetermined image is projected by a projector, and
control circuitry which controls an irradiation range of irradiation light on an inner wall depending on a position of the screen, wherein
the screen is configured to form a shape that enables light generated by the projector to arrive at the inner wall of the gantry,
a projected image projected by the projector includes a first region projected on the screen and a second region projected on the inner wall, and
the gantry includes a plurality of irradiators arrayed along the central axis on a space between a side face of a couch top which is movable along a central axis of the bore together with the screen, and the inner wall, or arrayed along the central axis on the inner wall positioned lower than an upper face of a headrest provided on the couch top, the irradiators irradiating the inner wall with the irradiation light having a hue corresponding to an image in the second region.

8. A medical image diagnostic apparatus comprising:
a gantry for medical imaging which includes a bore; and
a screen which is insertable into the bore and on which a predetermined image is projected by a projector, wherein
the screen is configured to form a shape that enables light generated by the projector to arrive at an inner wall of the gantry, and
a surface of the inner wall has a diffuse reflection function of diffusing and reflecting light projected by the projector in order to improve projection efficiency of an image projected on the inner wall.

9. A medical image diagnostic apparatus comprising:
a gantry for medical imaging which includes a bore;
a screen which is insertable into the bore and on which a predetermined image is projected by a projector; and
a movable carriage which includes at least one irradiator configured to emit irradiation light having a hue corresponding to an image in a second region toward a position of an inner wall of the gantry on which the image corresponding to the second region is projected, and which is configured to movably support the screen along a central axis of the bore, wherein
the screen is configured to form a shape that enables light generated by the projector to arrive at the inner wall of the gantry, and
a projected image projected by the projector includes a first region projected on the screen and the second region projected on the inner wall.

10. The medical image diagnostic apparatus according to claim 9, wherein the irradiator is installed at a position which prevents the irradiation light from arriving at a reflecting plate configured to reflect a part of the projected image projected on the screen, and at the screen.

11. The medical image diagnostic apparatus according to claim 9, wherein the movable carriage further including a shielding plate configured to shield irradiation of the irradiation light with respect to a reflecting plate configured to reflect a part of the projected image projected on the screen, and with respect to the screen.

* * * * *